(12) United States Patent
Iizuka

(10) Patent No.: US 10,597,775 B2
(45) Date of Patent: Mar. 24, 2020

(54) FILM FORMING METHOD AND FILM FORMING APPARATUS

(71) Applicant: TOYOTA JIDOSHA KABUSHIKI KAISHA, Toyota-shi, Aichi-ken (JP)

(72) Inventor: Kazutaka Iizuka, Nisshin (JP)

(73) Assignee: Toyota Jidosha Kabushiki Kaisha, Toyota-shi, Aichi-ken (JP)

(*) Notice: Subject to any disclaimer, the term of this patent is extended or adjusted under 35 U.S.C. 154(b) by 0 days.

(21) Appl. No.: 15/490,246

(22) Filed: Apr. 18, 2017

(65) Prior Publication Data

US 2017/0306483 A1    Oct. 26, 2017

(30) Foreign Application Priority Data

Apr. 25, 2016 (JP) ................. 2016-086812

(51) Int. Cl.
*C23C 16/44* (2006.01)
*C23C 16/54* (2006.01)
(Continued)

(52) U.S. Cl.
CPC ........ *C23C 16/4409* (2013.01); *C23C 16/042* (2013.01); *C23C 16/4412* (2013.01); *C23C 16/45561* (2013.01); *C23C 16/50* (2013.01); *C23C 16/52* (2013.01); *C23C 16/54* (2013.01); *H01J 37/3244* (2013.01); *H01J 37/32458* (2013.01); *H01J 37/32513* (2013.01);
(Continued)

(58) Field of Classification Search
CPC ................................................. C23C 16/4409
See application file for complete search history.

(56) References Cited

U.S. PATENT DOCUMENTS

2002/0029791 A1    3/2002 Matsuoka
2005/0211167 A1    9/2005 Gunji et al.
(Continued)

FOREIGN PATENT DOCUMENTS

JP    S59-69494 A    4/1984
JP    2002-184708    6/2002
(Continued)

*Primary Examiner* — Joseph A Miller, Jr.
(74) *Attorney, Agent, or Firm* — Finnegan, Henderson, Farabow, Garrett & Dunner, LLP

(57) ABSTRACT

A film forming apparatus comprises a film forming vessel comprising a first mold and a second mold that is arranged to be opposed to the first mold. The first mold is configured to include a first recessed portion and a first planar portion arranged around the first recessed portion and an exhaust port in a bottom portion of the first recessed portion. The film forming apparatus also comprises a seal member placed between the first planar portion of the first mold and the second mold. The seal member is configured to keep inside of the film forming vessel airtight; and an exhaust device connected with the exhaust port. The work is placed away from the first planar portion such that a film formation target part of the work faces an internal space of the first recessed portion when the film forming vessel is closed. A film forming method comprises (a) forming a film on part of the work by the film forming apparatus; (b) opening the film forming vessel after the (a); and (c) at a start of the (b), evacuating the film forming vessel via the exhaust port by the exhaust device.

4 Claims, 13 Drawing Sheets

(51) Int. Cl.
*H01J 37/32* (2006.01)
*C23C 16/04* (2006.01)
*C23C 16/455* (2006.01)
*C23C 16/50* (2006.01)
*C23C 16/52* (2006.01)

(52) U.S. Cl.
CPC .. *H01J 37/32568* (2013.01); *H01J 37/32715* (2013.01); *H01J 37/32743* (2013.01); *H01J 37/32788* (2013.01); *H01J 37/32834* (2013.01); *H01J 2237/3321* (2013.01)

(56) References Cited

U.S. PATENT DOCUMENTS

| | | | | |
|---|---|---|---|---|
| 2009/0183683 A1* | 7/2009 | Kobayashi | .......... | C23C 16/4401 118/726 |
| 2009/0194026 A1* | 8/2009 | Burrows | ................ | C23C 16/54 118/719 |
| 2011/0076848 A1* | 3/2011 | Datta | ........................ | B01J 3/03 438/689 |

FOREIGN PATENT DOCUMENTS

| | | |
|---|---|---|
| JP | 2005-194589 | 7/2005 |
| JP | 2009-62579 | 3/2009 |
| JP | 2012-238772 A | 12/2012 |
| JP | 2013-237883 | 11/2013 |
| TW | 2013-03972 A | 1/2013 |
| WO | WO 03/104524 A1 | 12/2003 |

* cited by examiner

FILM FORMING METHOD AND FILM FORMING APPARATUS

CROSS-REFERENCE TO RELATED APPLICATIONS

The present application claims priority to Japanese Patent application No. 2016-086812 filed on Apr. 25, 2016, the content of which is hereby incorporated by reference for all purpose.

BACKGROUND

Field

The present disclosure relates to a film forming method and a film forming apparatus.

Related Art

As an apparatus for film formation on a work, JP 2009-62679A describes an apparatus configured such that a work is placed between two halves of a vertically splittable film forming vessel and a film is formed on the work in the film forming vessel filled with a gas.

In the configuration that the work is placed between the halves of the film forming vessel, for example, a seal member may be provided in the film forming vessel or in the work, in order to keep the inside of the film forming vessel airtight. When the film forming vessel is opened after completion of film formation, however, a gas flow is likely to be formed from inside of the film forming vessel toward outside of the film forming vessel and is likely to cause an undesired substance produced in the film forming vessel in the course of film formation to adhere to the seal member. This is likely to fail to keep the air tightness in the film forming vessel when the film forming vessel is closed and is likely to cause poor film formation. Accordingly there is a demand for a technique that suppresses poor film formation when film formation is performed with a seal member provided in the film forming vessel or in the work.

SUMMARY

According to one aspect of the disclosure, there is provided a film forming method by a film forming apparatus configured to form a film on part of a work. The film forming apparatus comprises a film forming vessel comprising a first mold and a second mold that is arranged to be opposed to the first mold. The first mold is configured to include a first recessed portion and a first planar portion arranged around the first recessed portion and an exhaust port in a bottom portion of the first recessed portion. The film forming apparatus also comprises a seal member placed between the first planar portion of the first mold and the second mold. The seal member is configured to keep inside of the film forming vessel airtight when the film forming vessel is closed; an exhaust device connected with the exhaust port and configured to evacuate the film forming vessel; and an open-close device configured to open and close the film forming vessel. The work is placed away from the first planar portion such that a film formation target part of the work faces an internal space of the first recessed portion when the film forming vessel is closed. This film forming method comprises (a) forming a film on part of the work by the film forming apparatus; (b) moving the first mold relative to the work in a direction of separating away from each other and opening the film forming vessel by the open-close device, after the (a); and (c) at a start of the (b), evacuating the film forming vessel via the exhaust port by the exhaust device. In the film forming method of this aspect, when the film forming vessel is opened, the film forming vessel is evacuated via the exhaust port provided in the bottom portion of the first recessed portion. This forms a gas flow from the first planar portion side toward the exhaust port in the film forming vessel, when the film forming vessel is opened. This gas flow discharges an undesired substance out of the film forming vessel via the exhaust port and thereby suppresses the undesired substance from adhering to the seal member. This configuration accordingly keeps the inside of the film forming vessel airtight when the film forming vessel is closed, and thereby suppresses poor film formation.

According to another aspect of the disclosure, there is provided a film forming apparatus configured to form a film on part of a work. This film forming apparatus comprises a film forming vessel comprising a first mold and a second mold that is arranged to be opposed to the first mold. The first mold is configured to include a first recessed portion and a first planar portion arranged around the first recessed portion and an exhaust port in a bottom portion of the first recessed portion. The film forming apparatus also comprises a seal member placed between the first planar portion of the first mold and the second mold. The seal member is configured to keep inside of the film forming vessel airtight when the film forming vessel is closed; an exhaust device connected with the exhaust port and configured to evacuate the film forming vessel; an open-close device configured to open and close the film forming vessel; and a controller. The work is placed away from the first planar portion such that a film formation target part of the work faces an internal space of the first recessed portion when the film forming vessel is closed. The controller is configured to: after film formation on part of the work, control the open-close device to move the first mold relative to the work in a direction of separating away from each other and to open the film forming vessel; and when the film forming vessel is opened, control the exhaust device to evacuate the film forming vessel via the exhaust port. In the film forming apparatus of this aspect, the exhaust device evacuates the film forming vessel via the exhaust port provided in the bottom portion of the first recessed portion. This forms a gas flow from the first planar portion side toward the exhaust port. This gas flow discharges an undesired substance out of the film forming vessel via the exhaust port and thereby suppresses the undesired substance from adhering to the seal member. This configuration accordingly keeps the inside of the film forming vessel airtight when the film forming vessel is closed, and thereby suppresses poor film formation.

DETAILED DESCRIPTION

A. First Embodiment

A1. Configuration of Film Forming Apparatus

Figure 1:
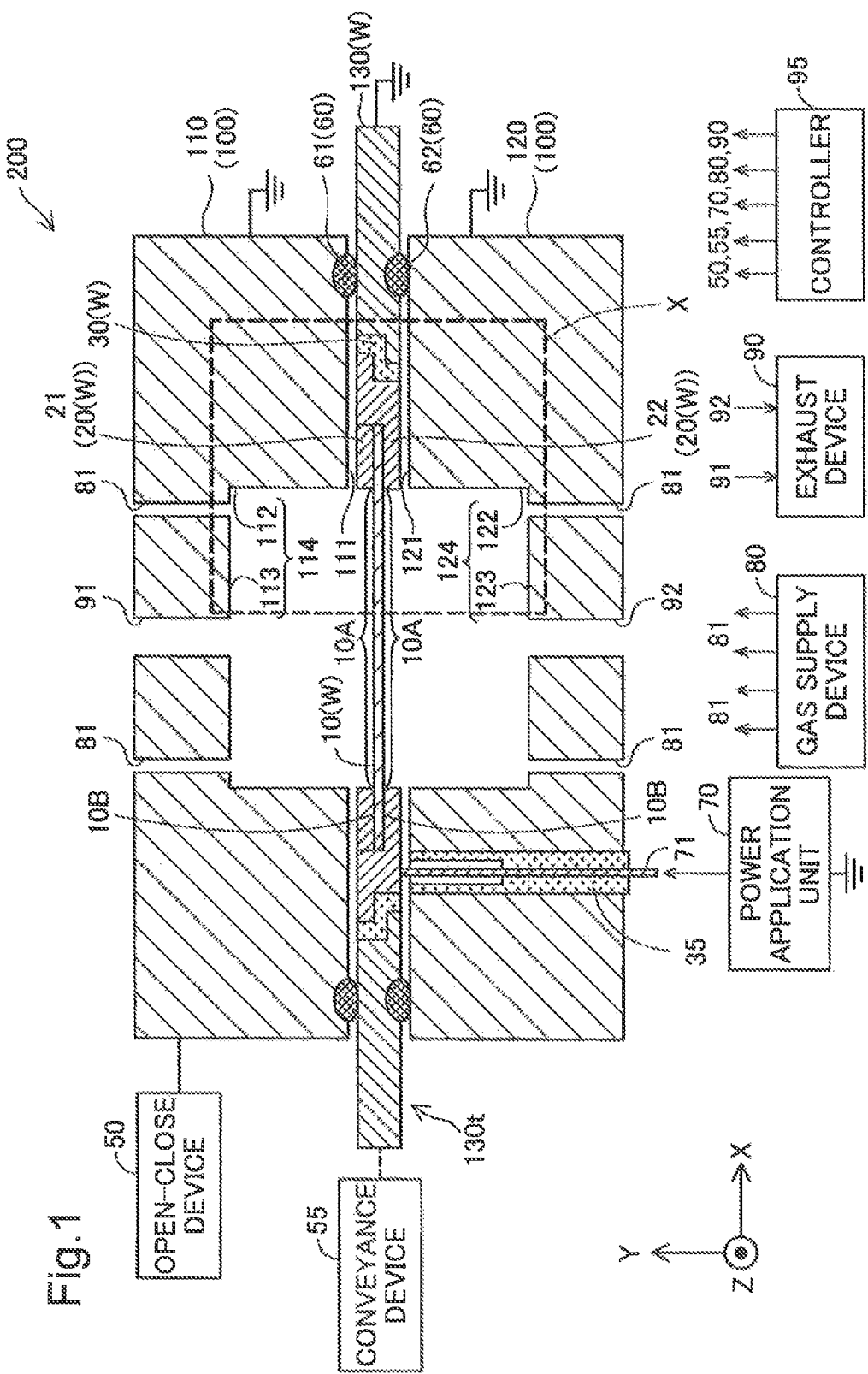
FIG. 1 is a schematic sectional view illustrating the configuration of a film forming apparatus according to a first embodiment of the disclosure.
Figure 2:
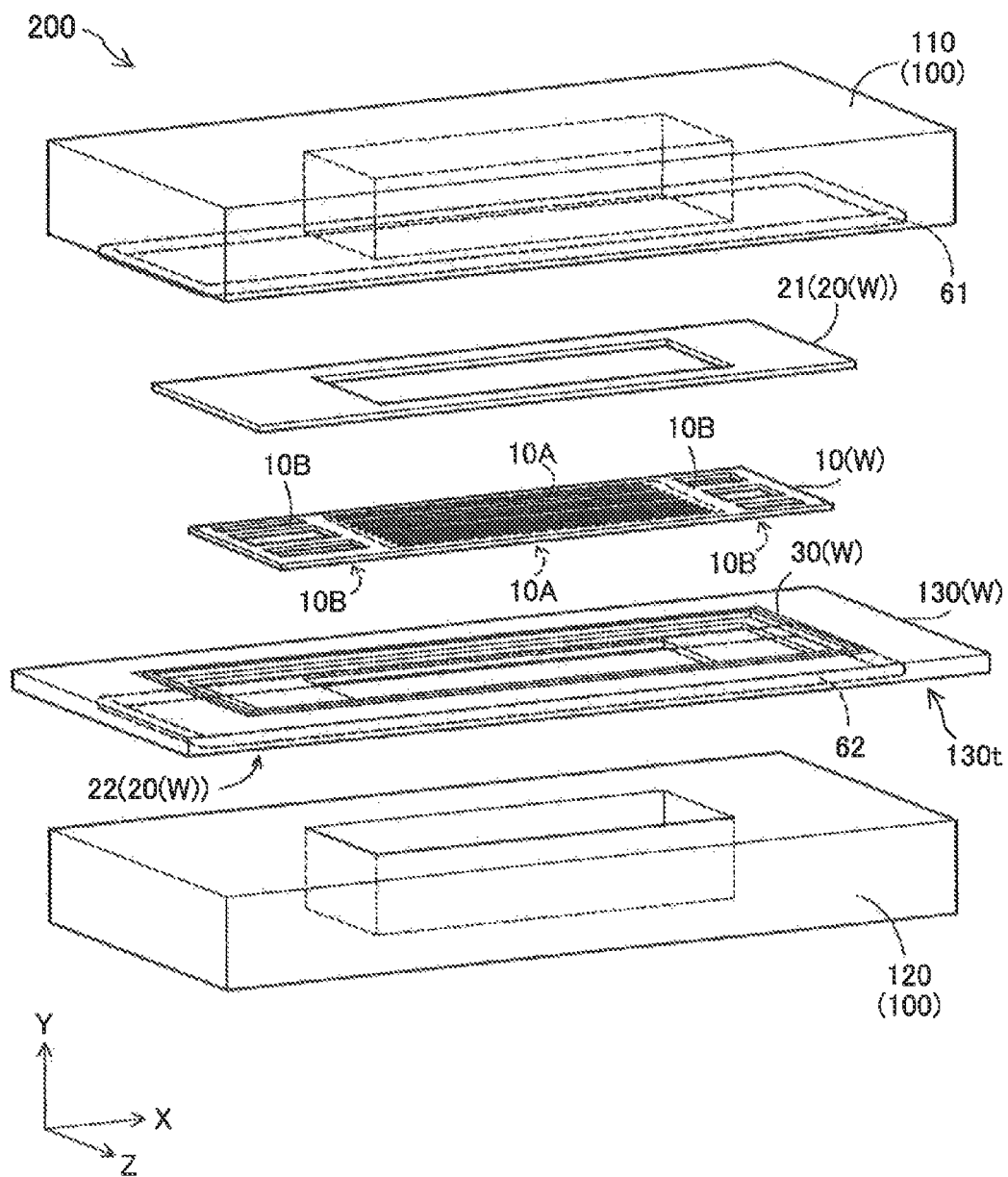
FIG. 2 is an exploded perspective view illustrating the film forming apparatus.

FIG. 1 is a schematic sectional view illustrating the configuration of a film forming apparatus 200 according to a first embodiment of the disclosure. FIG. 2 is an exploded perspective view illustrating the film forming apparatus 200. XYZ axes orthogonal to one another are illustrated in FIGS. 1 and 2. A Y-axis direction indicates a vertical direction, an X-axis direction indicates a horizontal direction, and a Z-axis direction indicates a direction perpendicular to both the Y axis and the X axis. +Y direction is upward direction, and −Y direction is downward direction. The same applies to subsequent drawings.

The film forming apparatus 200 is configured to form a film on a film formation target part 10A that is part of a work W. According to this embodiment, the film forming apparatus 200 may form a thin film on the film formation target part 10A by plasma CVD (chemical vapor deposition). According to this embodiment, the work W may include a film formation object 10, a masking member 20, an insulating member 30 and a pallet 130. According to this embodiment, the film formation object 10 is a tabular metal plate that is used as a base material for separators of a fuel cell. The film forming apparatus 200 may form, for example, a conductive carbon-based thin film on the film formation target part 10A of the film formation object 10.

The film forming apparatus 200 may include a film forming vessel 100, an open-close device 50, a seal member 60, an exhaust device 90 and a controller 95. The film forming apparatus 200 may further include a conveyance device 55, a power application unit 70 and a gas supply device 80. The open-close device 50, the conveyance device 55, the power application unit 70 and its electric power introduction portion 71, the gas supply device 80 and its supply ports 81, the exhaust device 90 and its exhaust ports 91 and 92 and the controller 95 are omitted from the illustration of FIG. 2.

The film forming vessel 100 is a splittable metal container. The film forming vessel 100 may include a first mold 110 and a second mold 120 arranged to be opposed to the first mold 110. The first mold 110 includes a first recessed portion 114 and a first planar portion 111 arranged around the first recessed portion 114. The first recessed portion 114 is recessed in a direction away from the work W and is recessed upward viewed from the film formation target part 10A of an upper face side of the work W according to this embodiment. The first recessed portion 114 includes a lateral portion 112 and a bottom portion 113. According to this embodiment, the connections between the first recessed portion 114 and the first planar portion 111 are located on a YZ plane to be flush with ends of the film formation target part 10A. The exhaust port 91 is provided in the bottom portion 113 of the first mold 110. The second mold 120 includes a second recessed portion 124 that is recessed downward viewed from the film formation target part 10A of a lower face side of the work W, and a second planar portion 121 arranged around the second recessed portion 124. The second recessed portion 124 includes a lateral portion 122 and a bottom portion 123. The second planar portion 121 is provided at a location corresponding to the first planar portion 111 of the first mold 110. According to this embodiment, the connections between the second recessed portion 124 and the second planar portion 121 are located on the YZ plane to be flush with the ends of the film formation target part 10A. The exhaust port 92 is provided in the bottom portion 123 of the second mold 120. According to this embodiment, the first planar portion 111 and the second planar portion 121 are arranged parallel to an XZ plane. The first mold 110 and the second mold 120 respectively include supply ports 81 provided to supply a gas from the gas supply device 80 into the film forming vessel 100, in addition to the exhaust ports 91 and 92. Openable and closable valves are provided, at the supply ports 81 and the exhaust ports 91 and 92. The second mold 120 also includes an electric power introduction portion 71 configured to apply a voltage to the work W. The second mold 120 is electrically insulated from the electric power introduction portion 71 by an insulating member 35. According to this embodiment, the film forming vessel 100 has a ground potential. In the film forming vessel 100, the work W is placed away from the first planar portion 111. The film formation target part 10A of the work W is arranged to face the internal space of the first recessed portion 114 when the film forming vessel 100 is closed.

The masking member 20 is a member configured to cover film formation non-target parts 10B of the film formation object 10. In other words, the masking member 20 is a member that is open in the film formation target part 10A. According to this embodiment, the masking member 20 may include an upper masking member 21 and a lower masking member 22. The upper masking member 21 is placed on the upper face side of the film formation object 10. The lower masking member 22 is placed on the lower face side of the film formation object 10. According to this embodiment, the lower masking member 22 is configured to support the film formation object 10. The masking member 20 is made of a conductive material. The film formation object 10 and the masking member 20 are placed in contact with each other to be electrically connected with each other.

The insulating member 30 is placed between the first planar portion 111 and the second planar portion 121. The insulating member 30 is placed in contact with the masking member 20 when the film formation target part 10A of the upper face side of the work W is arranged to face the internal space of the first recessed portion 114 and the film formation object 10 and the masking member 20 are placed away from the first planar portion 111. According to this embodiment, the insulating member 30 is also placed in contact with the masking member 20 when the film formation target part 10A of the lower face side of the work W is arranged to face the internal space of the second recessed portion 124 and the film formation object 10 and the masking member 20 are placed away from the second planar portion 121. According to this embodiment, the insulating member 30 is placed in contact with the lower masking member 22 to support the lower masking member 22. The insulating member 30 may be made of a ceramic material, such as alumina ($Al_2O_3$) or silicon dioxide ($SiO_2$).

The pallet 130 is a metal plate-like member. According to this embodiment, the pallet 130 also serves as a member configured to convey the film formation object 10, the masking member 20 and the insulating member 30 into the film forming vessel 100. The insulating member 30, the lower masking member 22, the film formation object 10 and the upper masking member 21 are placed in this sequence on the pallet 130. According to this embodiment, the pallet 130 has the ground potential.

The seal members 60 are placed between the first planar portion 111 of the first mold 110 and the second mold 120. The seal members 60 are members configured to keep the inside of the film formation vessel 100 airtight when the film forming vessel 100 is closed. According to this embodiment, the seal members 60 are rubber annular members. This embodiment employs O-rings for the seal members 60. According to this embodiment, the seal members 60 include a first seal member 61 and a second seal member 62. The first seal member 61 is located between the first planar portion 111 and the work W and is placed in contact with the first planar portion 111 and the work W when the work W is placed away from the first planar portion 111. According to this embodiment, the first seal member 61 is fit in a groove provided in the first planar portion 111 of the first mold 110 and is in contact with an upper face of the pallet 130 when the film forming vessel 100 is closed. The second seal member 62 is located between the second planar portion 121 and the work W and is placed in contact with the second planar portion 121 and the work W when the work W is placed away from the second planar portion 121. According to this embodiment, the second seal member 62 is fit in a groove provided in a lower face of the pallet 130 and is in contact with the second planar portion 121 when the film forming vessel 100 is closed.

The open-close device 50 is a device configured to open and close the film forming vessel 100. The open-close device 50 is configured to move the first mold 110 relative to the work W in a direction of separating away from each other, such as to open the film forming vessel 100. According to this embodiment, the open-close device 50 moves the first mold 110 upward relative to the work W to open the film forming vessel 100, while moving the first mold 110 downward relative to the work W to close the film forming vessel 100.

The conveyance device 55 is a device configured to convey the work W into the film forming vessel 100 and convey the work W out of the film forming vessel 100. According to this embodiment, when the conveyance device 55 is placed in contact with an end 130t of the pallet 130 and the film forming vessel 100 is opened, the conveyance device 55 conveys the pallet 130 and the insulating member 30, the masking member 20 and the film formation object 10 placed on the pallet 130 into the film forming vessel 100. The conveyance device 55 also moves the conveyed work W downward to place the work W on the second mold 120 via the second seal member 62. According to this embodiment, the conveyance device 55 is also configured to come into contact with the end 130t of the pallet 130 and move the pallet 130 upward relative to the second mold 120. The conveyance device 55 may also move the work W that is moved upward, along the XZ plane to convey the work W out of the film forming vessel 100. According to another embodiment, the open-close device 50 may be configured to be connectable with the pallet 130 and move the pallet 130 upward relative to the second mold 120.

The power application unit 70 is a device configured to produce a plasma. The power application unit 70 applies an electric power to the masking member 20 and the film formation object 10 of the work W. The power application unit 70 generates an electric field to produce a plasma from a raw material gas or an etching gas supplied into the film forming vessel 100. According to this embodiment, the electric power introduction portion 71, the film formation object 10 and the masking member 20 are negative poles, while the first mold 110, the second mold 120 and the pallet 130 are positive poles. According to this embodiment, the power application unit 70 applies a bias voltage to the film formation object 10 across the lower masking member 22. The power application unit 70 may apply, for example, a voltage of −3000 V to the electric power introduction portion 71. According to this embodiment, the film forming vessel 100 and the pallet 130 are connected to the ground (0 V).

The gas supply device 80 supplies a gas into the film forming vessel 100 via the supply ports 81. The gas supply device 80 is connected with tanks provided to store different types of gases. Changeover valves provided between the respective tanks and the supply ports 81 may be operated such that the gas supply device 80 changes over the type of the gas to be supplied to the supply ports 81 and thereby supplies the different types of gases into the film forming vessel 100. The gas supply device 80 is configured to supply a carrier gas and a raw material gas. According to this embodiment, the gas supply device 80 may supply, for example, nitrogen ($N_2$) gas or argon (Ar) gas as the carrier gas and may supply, for example, pyridine ($C_5H_5N$) gas as the raw material gas. The gas supply device 80 may supply, for example, nitrogen gas into the film forming vessel 100 after film formation by the film forming apparatus 200, in order to return the internal pressure of the film forming vessel 100 to a pressure level that allows the film forming vessel 100 to be opened by the open-close device 50.

The exhaust device 90 is a device configured to evacuate the film forming vessel 100 via the exhaust ports 91 and 92. The exhaust device 90 may be configured by, for example, a rotary pump, a diffusion pump or a turbo molecular pump. The exhaust device 90 serves to evacuate the film forming vessel 100 via the exhaust ports 91 and 92, prior to film formation. The exhaust device 90 also serves to evacuate the film forming vessel 100 via the exhaust ports 91 and 92 when the film forming vessel 100 is opened. The expression "when the film forming vessel 100 is opened" means "when the air tightness in the film forming vessel 100 is released". Accordingly, the exhaust device 90 serves to evacuate the film forming vessel 100 via the exhaust ports 91 and 92 at least when the air tightness in the film forming vessel 100 is released. The exhaust device 90 may evacuate the film forming vessel 100 via the exhaust ports 91 and 92 for a time period from the time immediately before the film forming vessel 100 is opened to the time when the film forming vessel 100 is opened. The exhaust device 90 may be configured to separately include a device configured to evacuate the film forming vessel 100 prior to film formation and a device configured to evacuate the film forming vessel 100 when the film forming vessel 100 is opened. The exhaust device 90 configured to evacuate the film forming vessel 100 when the film forming vessel 100 is opened may be, for example, a dust collector.

The controller 95 controls the operations of the entire film forming apparatus 200. The controller 95 includes a CPU and a memory. The CPU executes programs stored in the memory to control the film forming apparatus 200. These programs may be recorded in various recording media. After film formation on part of the work W, the controller 95 controls the open-close device 50 to move the first mold 110 relative to the work W in the direction of separating away from each other, so as to open the film forming vessel 100. The controller 95 also controls the exhaust device 90 to evacuate the film forming vessel 100 via the exhaust ports 91 and 92 when the film forming vessel 100 is opened. The controller 95 also controls the conveyance device 55 to convey the work W. The controller 95 additionally controls the gas supply device 80 to supply the gas into the film forming vessel 100 and controls the power application unit 70 to apply an electric power to the work W.

Figure 3:
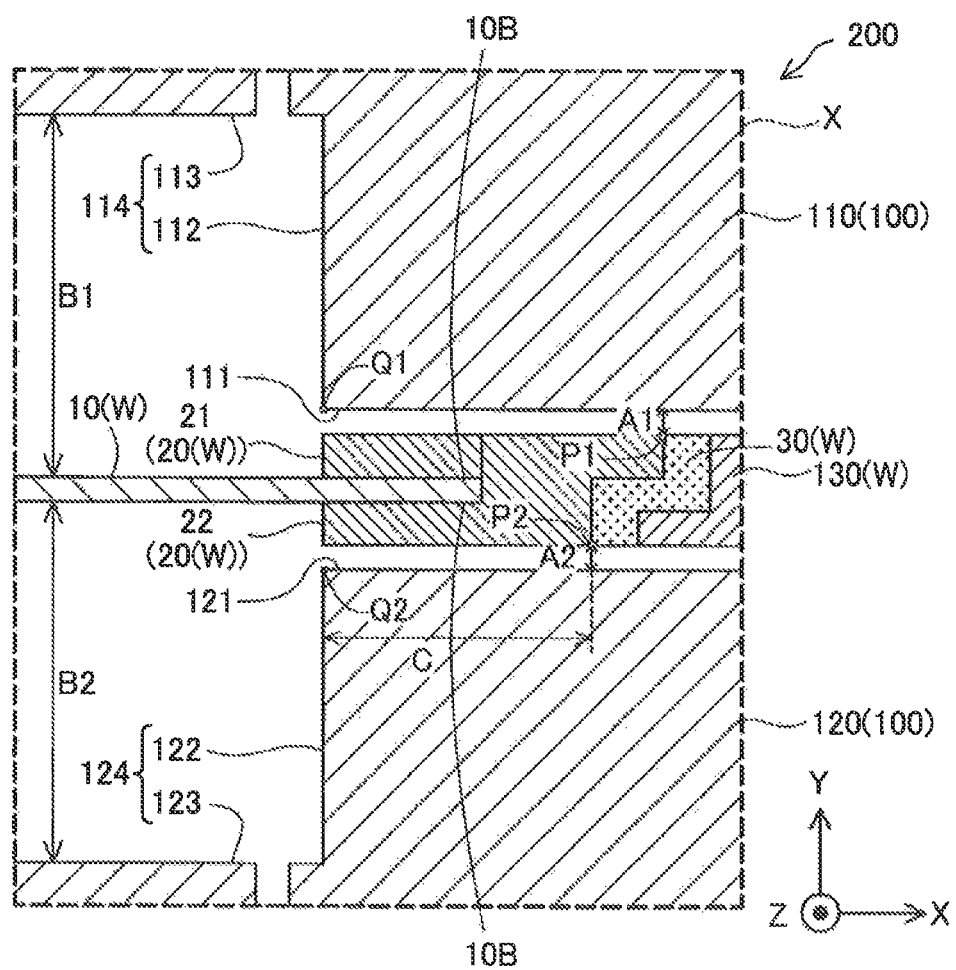
FIG. 3 is a partial schematic sectional view illustrating part of the configuration of the film forming apparatus.

FIG. 3 is a partial schematic sectional view illustrating part of the film forming apparatus 200. FIG. 3 illustrates an area X shown by the broken line in FIG. 1. A contact position P1 and a contact position P2 between the masking member 20 and the insulating member 30 are shown in FIG. 3. The contact position P1 is a position opposed to the first planar portion 111 among positions where the negative pole of the work W is in contact with the insulating member 30. The contact position P2 is a position opposed to the second planar portion 121 among the positions where the negative pole of the work W is in contact with the insulating member 30. FIG. 3 also shows a distance A1 between the contact position P1 and the first planar portion 111 and a distance B1 between the film formation object 10 and the bottom portion 113 of the first recessed portion 114. More specifically, the distance B1 denotes a distance between the negative pole of the work W opposed to the first recessed portion 114 and the bottom portion 113 of the first recessed portion 114. In the description below, the negative pole of the work W indicates the masking member 20 and the film formation object 10. FIG. 3 additionally shows a distance A2 between the contact position P2 and the second planar portion 121 and a distance B2 between the film formation object 10 and the bottom portion 123 of the second recessed portion 124. More specifically, the distance B2 denotes a distance between the negative pole of the work W opposed to the second recessed portion 124 and the bottom portion 123 of the second recessed portion 124. In the film forming apparatus 200, the distance A1 is smaller than the distance B1. In other words, a space formed by the negative pole of the work W and the first planar portion 111 is smaller than a space formed by the negative pole of the work W and the first recessed portion 114. According to this embodiment, the distance A2 is smaller than the distance B2. In other words, a space formed by the negative pole of the work W find the second planar portion 121 is smaller than a space formed by the negative pole of the work W and the second recessed portion 124.

According to this embodiment, the distance A1 and the distance A2 are shorter than the distances of sheaths formed between the negative pole (film formation object 10 and masking member 20) of the work W and the film forming vessel 100 (more specifically, the first planar portion 111 and the second planar portion 121) under application of an electric power between the negative pole of the work W and the film forming vessel 100 as the positive pole. According to this embodiment, the distance A1 and the distance A2 are equal to or less than 2.0 mm. The distance A1 and the distance A2 are preferably equal to or greater than 0.5 mm, in terms of ensuring sufficient insulation of the film forming vessel 100 from the film formation object 10 and the masking member 20.

FIG. 3 further shows a shortest distance C along the X axis from a connecting position Q1 of the first recessed portion 114 with the first planar portion 111 and a connecting position Q2 of the second recessed portion 124 with the second planar portion 121 to the contact positions P1 and P2. The distance C also denotes a shortest distance along the X axis from the lateral portion 112 of the first recessed portion 114 and the lateral portion 122 of the second recessed portion 124 to the contact positions P1 and P2. According to this embodiment, the distance C is larger than 0 (zero). According to this embodiment, the distance C is equal to or larger than 10 mm.

A2. Film Forming Method

Figure 4:
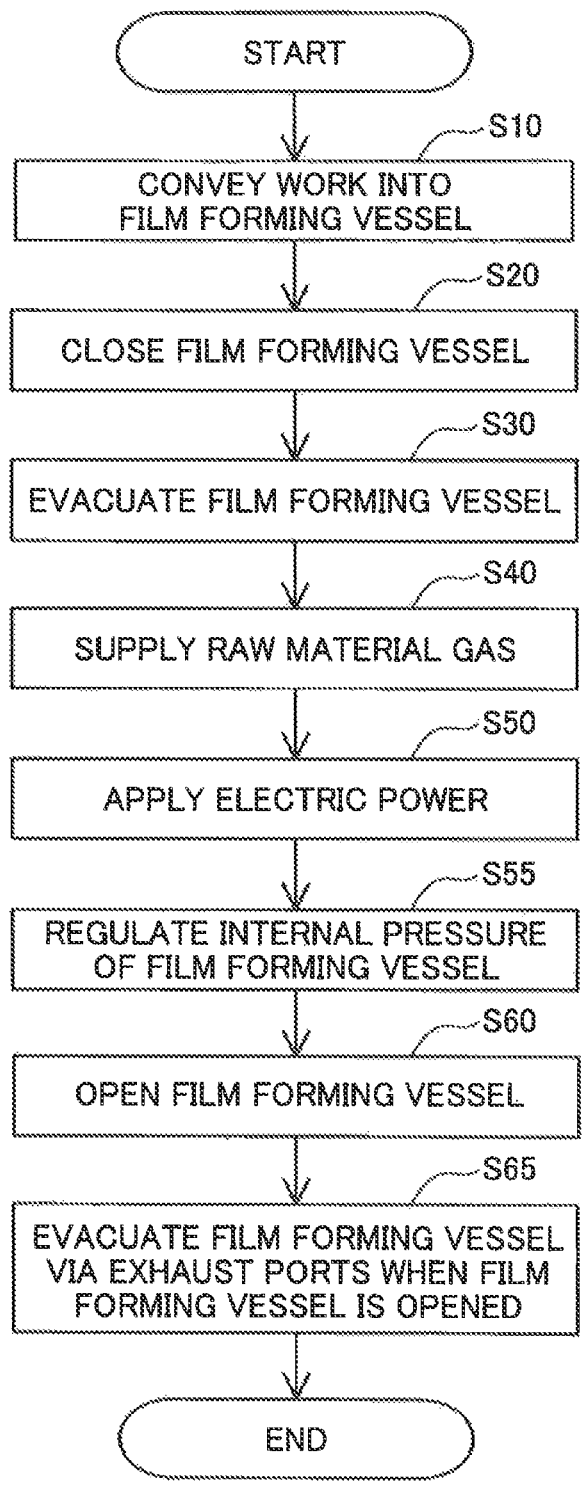
FIG. 4 is a process chart showing a film forming method by the film forming apparatus.

FIG. 4 is a process chart showing a film forming method by the film forming apparatus 200. In the procedure of film formation by the film forming apparatus 200, the work W is first conveyed into the film forming vessel 100 (step S10). According to this embodiment, the insulating member 30, the lower masking member 22 and the film formation object 10 are placed on the pallet 130, and the upper masking member 21 is further placed on the film formation object 10. This configuration causes the film formation non-target parts 10B of the film formation object 10 to be covered by the masking member 20. The first mold 110 of the film forming vessel 100 is subsequently moved upward by the open-close device 50, and the pallet 130 with the insulating member 30, the masking member 20 and the film formation objet 10 placed thereon is conveyed into the film forming vessel 100 by the conveyance device 55. The conveyed pallet 130 is moved downward and is placed on the second mold 120 via the second seal member 62.

The film forming vessel 100 is then closed (step S20). According to this embodiment, after the pallet 130 is conveyed into the film forming vessel 100, the first mold 110 is moved downward by the open-close device 50. When the film forming vessel 100 is closed, the film formation target part 10A is arranged to face the internal space of the first recessed portion 114 and the internal space of the second recessed portion 124 in the film forming vessel 100. The negative pole of the work W is placed away from the first planar portion 111 and the second planar portion 121. The distance A1 between the contact position P1 of the negative pole (masking member 20) of the work W with the insulating member 30 and the first planar portion 111 is smaller than the distance B1 between the negative pole (film formation object 10) of the work W and the first recessed portion 114. The distance A2 between the contact position P2 of the negative pole (masking member 20) of the work W with the insulating member 30 and the second planar portion 121 is smaller than the distance B2 between the negative pole (film formation object 10) of the work W and the second recessed portion 124

Subsequently the film forming vessel 100 is evacuated (step S30). According to this embodiment, the film forming apparatus 200 may be placed, for example, in a nitrogen atmosphere. At step S30, the exhaust device 90 is used to discharge the nitrogen gas from the film forming vessel 100 via the exhaust ports 91 and 92, so as to evacuate the film forming vessel 100.

After evacuation of the film forming vessel 100, a raw material gas is supplied into the film forming vessel 100 (step S40). More specifically, at step S40, the gas supply device 80 supplies a carrier gas and a raw material gas into the film forming vessel 100 via the supply ports 81. For example, hydrogen gas and argon gas may be supplied as the carrier gas into the film forming vessel 100. For example, nitrogen gas and pyridine gas may be supplied as the raw material gas into the film forming vessel 100. At step S40, the internal pressure of the film forming vessel 100 may be, for example, 11 Pa. For example, for the purpose of enhancing the film formation rate, prior to supply of the raw material gas, the power application unit 70 may apply an electric power between the negative pole (film formation object 10 and masking member 20) of the work W and the film forming vessel 100 to raise the temperature of the work W.

An electric power is then applied between the negative pole (film formation object 10 and masking member 20) of the work W and the film forming vessel 100 (step S50). When the electric power is applied between the negative pole of the work W and the film forming vessel 100 by the power application unit 70, a plasma is produced in the first recessed portion 114 and in the second recessed portion 124, so as to form a thin film on the film formation target part 10A of the film formation object 10. At step S50, an electric power of, for example, −3000V may be applied to the negative pole of the work W by the power application unit 70. Termination of step S50 stops the supply of the raw material gas and the application of an electric power and completes the film formation. The process of steps S40 and step S50 is also called "process (a)".

On completion of the film formation, the internal pressure of the film forming vessel 100 is regulated (step S55). At step S55, the internal pressure of the film forming vessel 100 is regulated to be lower than the pressure outside of the film forming vessel 100. According to this embodiment, nitrogen gas is supplied into the film forming vessel 100 by the gas supply device 80, in order to return the internal pressure of the film forming vessel 100 to a pressure level that allows the film forming vessel 100 to be opened by the open-close device 50. The supply amount of the nitrogen gas is controlled, such that the internal pressure of the film forming vessel 100 becomes lower than the pressure outside of the film forming vessel 100.

The film forming vessel 100 is then opened (step S60). According to this embodiment, the controller 95 controls the open-close device 50 to move the first mold 110 upward relative to the work W and thereby open the film forming vessel 100. Opening the film forming vessel 100 releases the air tightness in the film forming vessel 100. The process of step S60 is also called "process (b)".

At the start of step S60, the controller 95 controls the exhaust device 90 to evacuate the film forming vessel 100 via the exhaust ports 91 and 92 (step S65). The process of step S65 is also called "process (c)".

Figure 5:
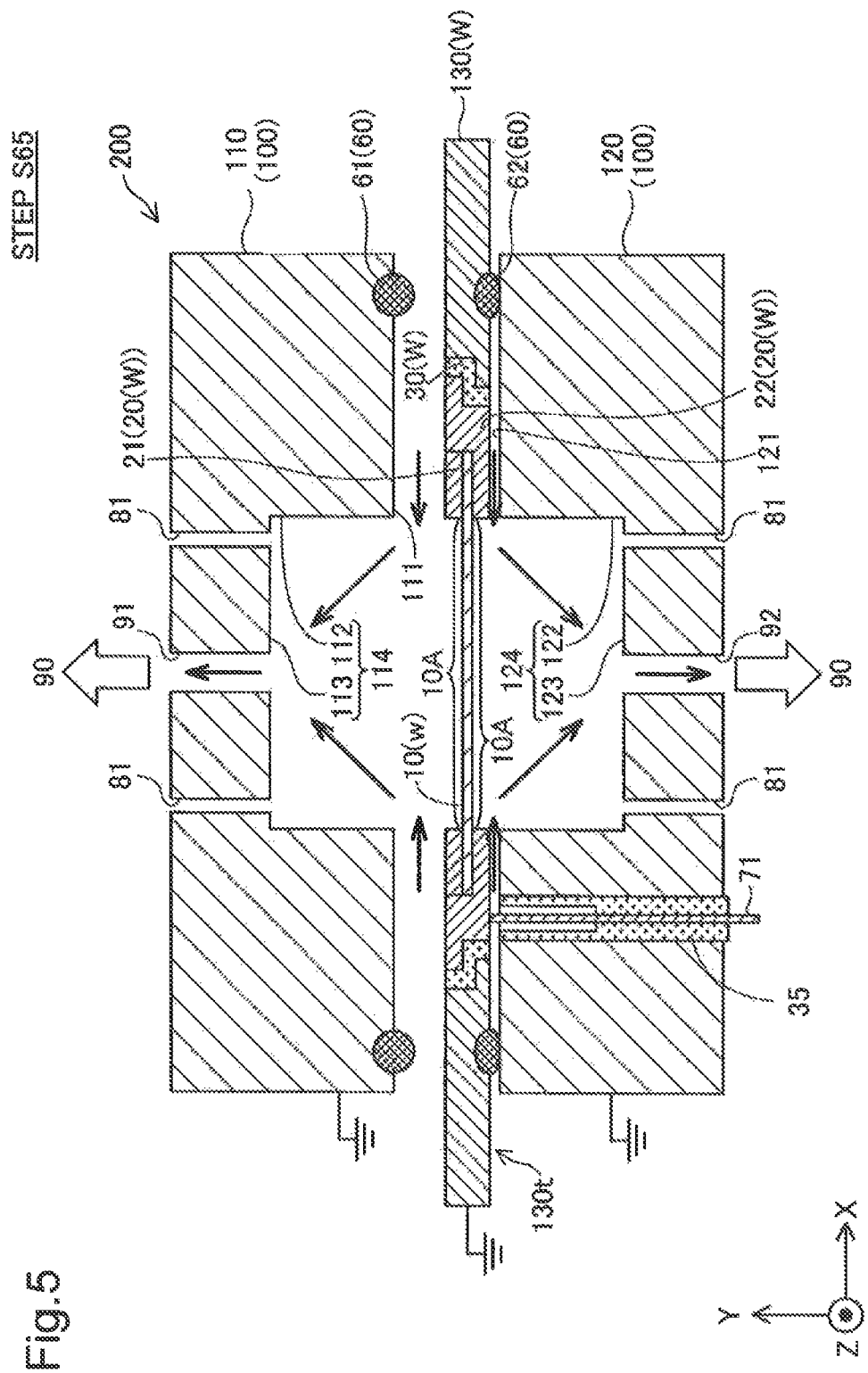
FIG. 5 is a diagram illustrating a process of step S65.

FIG. 5 is a diagram illustrating the process of step S65. The open-close device 50, the conveyance device 55, the power application unit 70, the gas supply device 80, the exhaust device 90 and the controller 95 are omitted from the illustration of FIG. 5 and subsequent drawings. Arrows shown in the film forming vessel 100 of FIG. 5 indicate the directions of gas flows formed in the film forming vessel 100. When the film forming vessel 100 is opened, the film forming vessel 100 is evacuated via the exhaust ports 91 and 92 by the exhaust device 90 (step S65 in FIG. 4). The gas flow is accordingly formed from the first planar portion 111-side toward the exhaust port 91 in the film forming vessel 100. The insulating member 30, the masking member 20 and the film formation object 10 are placed on the pallet 130 in such a manner that the air tightness is not kept between the respective components. The gas flow is accordingly formed from the second planar portion 121-side toward the exhaust port 92. The gas flow moves an undesired substance produced in the course of film formation from the first planar portion 111 of the first mold 110 toward the exhaust port 91 and discharges the undesired substance out of the film forming vessel 100 via the exhaust port 91. The gas flow also moves the undesired substance from the second planar portion 121 of the second mold 120 toward the exhaust port 92 and discharges the undesired substance out of the film forming vessel 100 via the exhaust port 92. According to this embodiment, the process of step S55 causes the internal pressure of the film forming vessel 100 to be lower than the pressure outside of the film forming vessel 100 before the film forming vessel 100 is opened. Accordingly, when the film forming vessel 100 is opened, the gas flow is formed from outside of the film forming vessel 100 toward inside of the film forming vessel 100, in addition to the above gas flows.

After the process of step S65, the work W is moved relative to the second mold 120 in a direction of separating away from each other. According to this embodiment, the conveyance device 55 comes into contact with the end 130t of the pallet 130 and moves the pallet 130 (work W) upward relative to the second mold 120. The work W is then moved along the XZ plane and is conveyed out of the film forming vessel 100 by the conveyance device 55. This completes the series of film forming method by the film forming apparatus 200.

A3. Advantageous Effects

A3-1. Advantageous Effect 1

In general, a work may be placed between two halves of a splittable film forming vessel, and film formation may be performed in the film forming vessel that is kept airtight with seal members provided in the film forming vessel or the work. When the film forming vessel is opened after completion of film formation, this configuration makes the internal pressure of the film forming vessel equivalent to the pressure outside of the film forming vessel. The undesired substance in the film forming vessel is thus likely to be moved outside of the film forming vessel and adhere to the seal member. The undesired substance may be, for example, a film depositing on the inner wall of the film forming vessel, in addition to on the film formation object, in the course of film formation. The undesired substance may also be flakes of the film depositing in the film forming vessel, which fall off by any of opening-closing operations of the film forming vessel during film formation, an operation of conveying the work into the film forming vessel and an operation of conveying the work out of the film forming vessel. The undesired substance may also be a foreign substance coming from outside of the film forming vessel toward inside of the film forming vessel by any of these operations. The presence of such undesired substance adhering to the seal member may fail to keep the inside of the film forming vessel airtight when the film forming vessel is closed, and is likely to cause poor film formation. In the film forming apparatus 200 and the film forming method of the first embodiment, however, the film forming vessel 100 is evacuated via the exhaust port 91 provided in the bottom portion 113 of the first recessed portion 114, when the film forming vessel 100 is opened. This forms the gas flow from the first planar portion 111-side toward the exhaust port 91 in the film forming vessel 100 when the film forming vessel 100 is opened. This gas flow discharges the undesired substance out of the film forming vessel 100 via the exhaust port 91 and thereby suppresses the undesired substance from adhering to the seal member 60. This configuration accordingly keeps the inside of the film forming vessel 100 airtight when the film forming vessel 100 is closed, and thereby suppresses poor film formation.

In the film forming apparatus 200 and the film forming method of the first embodiment, the film forming vessel 100 is also evacuated by the exhaust device 90 via the exhaust port 92 provided in the bottom portion 123 of the second recessed portion 124. This forms the gas flow from the second planar portion 121-side toward the exhaust port 92 in the film forming vessel 100 when the film forming vessel 100 is opened. This gas flow discharges the undesired substance out of the film forming vessel 100 via the exhaust port 92 and thereby suppresses the undesired substance from adhering to the seal member 60. This configuration accordingly keeps the inside of the film forming vessel 100 airtight when the film forming vessel 100 is closed, and thereby suppresses poor film formation.

The undesired substance is likely to be accumulated in a lower part of the film forming vessel 100. In the film forming apparatus 200 and the film forming method of the first embodiment, however, the gas flow is formed from the second planar portion 121-side toward the exhaust port 92 in the second mold 120 placed below the work W, when the film forming vessel 100 is opened. This configuration enables the undesired substance to be discharged via the exhaust port 92 in the mold placed in the lower part where the undesired substance is likely to be accumulated. This accelerates discharge of the undesired substance from the film forming apparatus 200 and further suppresses the undesired substance from adhering to the seal member 600. Accordingly this configuration further keeps the inside of the film forming vessel 100 airtight when the film forming vessel 100 is closed, and thereby further suppresses poor film formation.

According to this embodiment, the internal pressure of the film forming vessel 100 is regulated to be lower than the pressure outside of the film forming vessel 100 when the film forming vessel 100 is opened. This forms the gas flow from outside of the film forming vessel 100 toward inside of the film forming vessel 100 when the film forming vessel 100 is opened. This configuration further suppresses the undesired substance present in the film forming vessel 100 from adhering to the seal member 60.

A3-2. Advantageous Effect 2

In the film forming apparatus 200 of the first embodiment, the insulating member 30 that comes into contact with the negative pole (masking member 20 and film formation object 10) of the work W is placed between the first planar portion 111 and the second planar portion 121 when the film forming vessel 100 is closed. The distance A1 between the contact position P1 of the negative pole of the work W with the insulating member 30 and the first planar portion 111 is smaller than the distance B1 between the negative pole of the work W and the bottom portion 113 of the first recessed portion 114. This configuration suppresses invasion of plasma from the first recessed portion 114 or the second recessed portion 124 into the space formed by the negative pole of the work W and the first planar portion 111 during film formation or etching using the plasma. This accordingly reduces the amount of plasma at the contact position P1 and thereby reduces the possibility of abnormal electrical discharge.

Similarly the distance A2 between the contact position P2 of the negative pole of the work W opposed to the second planar portion 121 with the insulating member 30 and the second planar portion 121 is smaller than the distance B2 between the negative pole of the work W and the bottom portion 123 of the second recessed portion 124. This configuration suppresses invasion of plasma from the second recessed portion 124 or the first recessed portion 114 into the space formed by the negative pole of the work W and the second planar portion 121. This accordingly reduces the amount of plasma at the contact position P2 and thereby reduces the possibility of abnormal electrical discharge.

The distance C along the X axis from the connecting position Q1 of the first recessed portion 114 with the first planar portion 111 and the connecting position Q2 of the second recessed portion 124 with the second planar portion 121 to the insulating member 30 is larger than 0 (zero). This causes the space for plasma production formed by the first recessed portion 114 and the second recessed portion 124 to be away from the contact positions P1 and P2 between the negative pole of the work W and the insulating member 30. This configuration further reduces the amount of plasma at the contact positions P1 and P2 and thereby further reduces the possibility of abnormal electrical discharge.

The distance A1 between the contact position P1 of the negative pole of the work W with the insulating member 30 and the first planar portion 111 is shorter than the distance of the sheath formed between the negative pole of the work W and the first planar portion 111. This configuration interferes with production of plasma between the negative pole of the work W and the first planar portion 111. The distance A2 between the contact position P2 of the negative pole of the work W with the insulating member 30 and the second planar portion 121 is shorter than the distance of the sheath formed between the negative pole of the work W and the second planar portion 121. This configuration interferes with production of plasma between the negative pole of the work W and the second planar portion 121. This effectively reduces the amount of plasma at the contact positions P1 and P2 and thereby effectively reduces the possibility of abnormal electrical discharge.

The distance and the distance A2 are equal to or less than 2.0 mm. This configuration further suppresses invasion of plasma from the first recessed portion 114 and the second recessed portion 124 into the space formed by the negative pole of the work W and the first planar portion 111 and into the space formed by the negative pole of the work W and the second planar portion 121. This configuration interferes with production of plasma between the negative pole of the work W and the first planar portion 111. This also interferes with production of plasma between the negative pole of the work W and the second planar portion 121. This further reduces the amount of plasma at the contact positions P1 and P2 and thereby further reduces the possibility of abnormal electrical discharge.

In the film forming apparatus 200, the film formation target part 10A of the work W is arranged to face the internal space of the first recessed portion 114 and to face the internal space of the second recessed portion 124. The insulating member 30 and the end of the negative pole (masking member 20) of the work W are located between the first planar portion 111 and the second planar portion 121. This configuration allows for downsizing of the film forming apparatus 200, compared with a configuration that the entire work W is placed in the space for plasma production. Furthermore, the film forming apparatus 200 provides a small space of evacuation for the purpose of film formation. This shortens the time period required for evacuation and thereby shortens the time period required for film formation on the film formation target part 10A.

A4. Modifications of First Embodiment

A4-1. Modification 1 of First Embodiment

According to the first embodiment described above, the exhaust device 90 evacuates the film forming vessel 100 via the exhaust port 91 connected with the first mold 110 and via the exhaust port 92 connected with the second mold 120, when the first mold 110 is moved away relative to the work W. According to a modification, for example, the film forming vessel 100 may be evacuated only via the exhaust port 91 connected with the first mold 110, while the valve may be kept closed at the exhaust port 92 connected with the second mold 120. In another example, the film forming vessel 100 may be evacuated only via the exhaust port 92 connected with the second mold 120, while the valve may be kept closed at the exhaust port 91 connected with the first mold 110. In this modified configuration, the gas flow may be formed from the first planar portion 111-side toward the exhaust port 91 or the gas flow may be formed from the second planar portion 121-side toward the exhaust port 92, when the film forming vessel 100 is opened. This modified configuration suppresses the undesired substance from adhering to the seal member 60. This modified configuration accordingly keeps the inside of the film forming vessel 100 airtight when the film forming vessel 100 is closed, and thereby suppresses poor film formation.

A4-2. Modification 2 of First Embodiment

According to the first embodiment described above, the supply amount of nitrogen gas by the gas supply device 80 is controlled to make the internal pressure of the film forming vessel 100 lower than the pressure outside of the film forming vessel 100 at step S55 (shown in FIG. 4). According to a modification, in the process of making the internal pressure of the film forming vessel 100 lower than the pressure outside of the film forming vessel 100 at step S55, the gas supply device 80 may first serve to supply the nitrogen gas into the film forming vessel 100 to make the internal pressure of the film forming vessel 100 equal to the pressure outside of the film forming vessel 100 or to make the internal pressure of the film forming vessel 100 higher than the pressure outside of the film forming vessel 100. The exhaust device 90 may subsequently serve to evacuate the film forming vessel 100. This results in making the internal pressure of the film forming vessel 100 lower than the pressure outside of the film forming vessel 100. According to another modification, when the film forming vessel 100 is configured to be openable by the open-close device 50, the process of step S55 (shown in FIG. 4) may be omitted, and the supply of nitrogen gas by the gas supply device 80 may be omitted. When the film forming vessel 100 is configured to be operable by the open-close device 50, the exhaust device 90 may be configured to perform evacuation before the film forming vessel 100 is opened. More specifically, as long as the gas flow is formed from outside of the film forming vessel 100 toward inside of the film forming vessel 100 to discharge the undesired substance through the exhaust port 91 when the film forming vessel 100 is opened, the supply of the gas by the gas supply device 80 and the evacuation by the exhaust device 90 after film formation may be appropriately controlled.

A4-3. Modification 3 of First Embodiment

Figure 6:
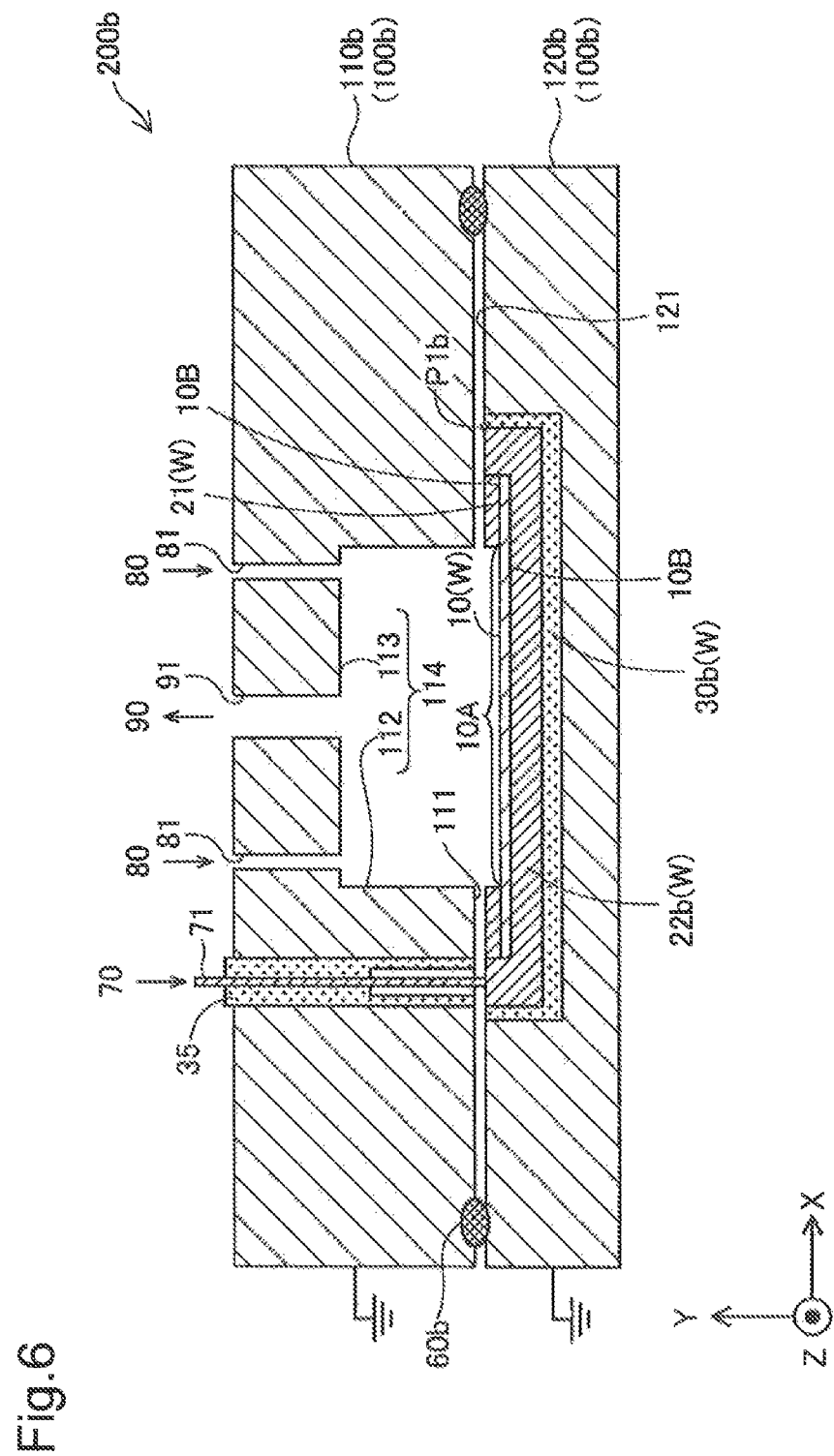
FIG. 6 is a diagram illustrating a film forming apparatus according to modification 3 of the first embodiment.

FIG. 6 is a diagram illustrating a film forming apparatus 200b according to modification 3 of the first embodiment. The film forming apparatus 200b is configured to perform film formation only on the first recessed portion 114-side of the film formation object 10, unlike the film forming apparatus 200 of the first embodiment. In this modification, there is no space between a second mold 120b of a film forming vessel 100b and the film formation object 10. An insulating member 30b is placed on to be in contact with the second mold 120b, and a lower masking member 22b is placed on to be in contact with the insulating member 30b. An entire lower face of the film formation object 10 is placed on to be in contact with the lower masking member 22b. A seal member 60b is placed in contact with a first planar portion 111 of a first mold 110b and in contact with the second mold 120b. According to this modification, the second mold 120b is configured without the exhaust port 92, and the work W is configured to exclude the pallet 130. According to this modification, an electric power introduction portion 71 is provided on the first mold 110b-side. According to this modification, the exhaust port 91 is provided in the bottom portion 113 of the first recessed portion 114, like the first embodiment described above. A distance between a contact position P1b of the negative pole (lower masking member 22) of the work W with the insulating member 30b and the first planar portion 111 is smaller than the distance between the work W and the bottom portion 113 of the first recessed portion 114. The other configuration of the film forming apparatus 200b of this modification is similar to that of the film forming apparatus 200 of the first embodiment described above and is thus not specifically described. The film forming method by the film forming apparatus 200b of this modification is similar to the film forming method by the film forming apparatus 200 of the first embodiment described above, except that the film forming vessel 100b is evacuated only via the exhaust port 91 of the first mold 110b when the film forming vessel 100b is opened, and is thus not specifically described.

According to this modification, the film forming vessel 100b is evacuated via the exhaust port 91 when the film forming vessel 100b is opened. This forms the gas flow from the first planar portion 111-side toward the exhaust port 91 in the film forming vessel 100b. Like the first embodiment described above, this configuration of the modification suppresses the undesired substance from adhering to the seal member 60b. This accordingly keeps the inside of the film forming vessel 100b airtight when the film forming vessel 100b is closed, and thereby suppresses poor film formation. Like the first embodiment described above, the film forming apparatus 200b also reduces the possibility of abnormal electrical discharge.

A4-4. Modification 4 of First Embodiment

Figure 7:
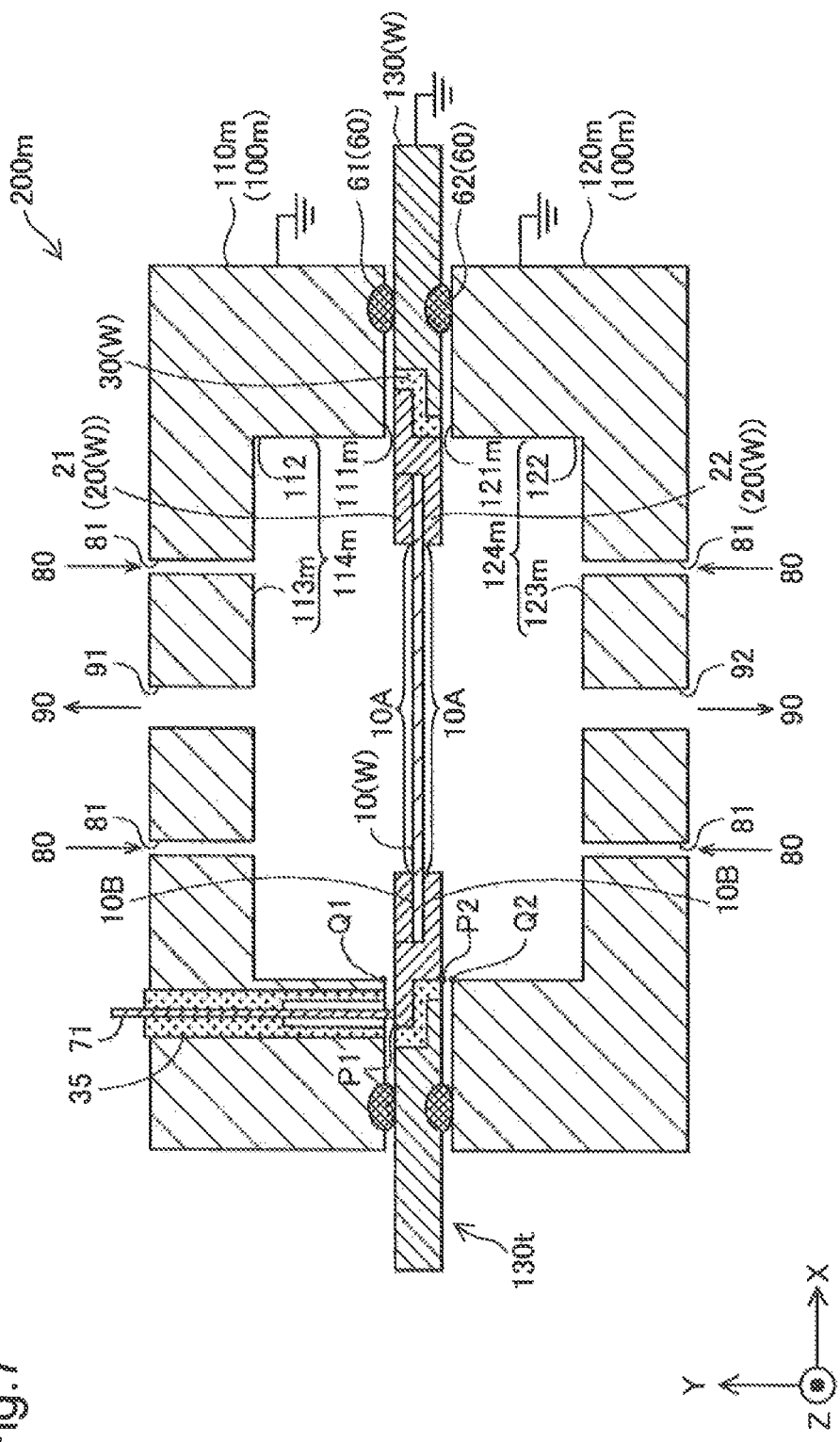
FIG. 7 is a diagram illustrating a film forming apparatus according to modification 4 of the first embodiment.

FIG. 7 is a diagram illustrating a film forming apparatus 200m according to modification 4 of the first embodiment. In the film forming apparatus 200m of this modification, a shortest distance along a first planar portion 111m from a connecting position Q1 of a first recessed portion 114m with the first planar portion 111m and a connecting position Q2 of a second recessed portion 124m with a second planar portion 121*m* to the contact positions P1 and P2 of the negative pole of the work W with the insulating member 30 is 0 (zero). According to this modification, the connecting position Q2 and the contact position P2 are located on an identical YZ plane. Accordingly, as shown in FIG. 7, in a film forming vessel 100*m*, the upper masking member 21 is exposed inside of the first recessed portion 114*m* of a first mold 110*m*, and part of the lower masking member 22 is exposed inside of the second recessed portion 124*m* of a second mold 120*m*. As in the first embodiment described above, in this modification, the distance between the contact position P1 and the first planar portion 111*m* is smaller than the distance between the negative pole of the work W and a bottom portion 113*m* of the first recessed portion 114*m*. Similarly the distance between the contact position P2 and the second planar portion 121*m* is smaller than the distance between the negative pole of the work W and a bottom portion 123*m* of the second recessed portion 124*m*. The other configuration of the film forming apparatus 200*m* of this modification is similar to that of the film forming apparatus 200 of the first embodiment described above and is thus not specifically described. Like the first embodiment described above, the film forming apparatus 200*m* of this modification keeps the inside of the film forming vessel 100*m* airtight when the film forming vessel 100*m* is closed, and thereby suppresses poor film formation. The film forming apparatus 200*m* also reduces the possibility of abnormal electrical discharge.

A4-5. Modification 5 of First Embodiment

According to the first embodiment described above, the work W is configured to include the film formation object 10, the masking member 20, the insulating member 30 and the pallet 130. According to a modification, however, the work W may be configured to include only the film formation object 10. In other words, the work W may be configured to exclude the masking member 20, the insulating member 30 and the pallet 130. In this modification, the second seal member 62 may be provided on a lower face of the film formation object 10 or may be provided on the second planar portion 121 of the second mold 120. The film formation object 10 may be conveyed by the conveyance device 55. In this modification, the above contact position P1 may be a position where the film formation object 10 is in contact with the first seal member 61, and the above contact position P2 may be a position where the film formation object 10 is in contact with the second seal member 62. The above distance C may be a shortest distance along the X axis from the connecting position of the first recessed portion 114 with the first planar portion 111 and the connecting position of the second recessed portion 124 with the second planar portion 121 to the position where the film formation object 10 is in contact with the first seal member 61 or the second seal member 62.

According to another modification, the work W may be configured to include the film formation object 10 and the masking member 20. In other words, the work W may be configured to exclude the insulating member 30 and the pallet 130. In this modification, the second seal member 62 may be provided on a lower face of the film formation object 10 or the lower masking member 22 or may be provided on the second planar portion 121 of the second mold 120. The film formation object 10 and the masking member 20 may be conveyed by the conveyance device 55. In this modification, the above contact position P1 may be a position where the film formation object 10 or the masking member 20 is in contact with the first seal member 61, and the above contact position P2 may be a position where the film formation object 10 or the masking member 20 is in contact with the second seal member 62. The above distance C may be a shortest distance along the X axis from the connecting position of the first recessed portion 114 with the first planar portion 111 and the connecting position of the second recessed portion 124 with the second planar portion 121 to the position where the film formation object 10 or the masking member 20 is in contact with the first seal member 61 or the second seal member 62.

A4-6. Modification 6 of First Embodiment

According to the first embodiment described above, the film forming apparatus 200 employs plasma CVD for film formation. The film forming apparatus 200 may, however, employ another technique such as physical vapor deposition (PVD) for film formation on the film formation target part 10A. For example, the film forming apparatus 200 may be equipped with a mechanism of vaporizing (or sublimating) a film formation material in the film forming vessel 100 and may form a film on the film formation target part 10A by the vapor deposition technique. In another example, the film forming apparatus 200 may be equipped with a mechanism of causing particles obtained by vaporization of the film formation material to pass through plasma and may form a film on the film formation target part 10A by the ion plating technique. In another example, the film forming apparatus 200 may be equipped with a mechanism of causing high-energy particles to collide against the film formation material (target) and may form a film on the film formation target part 10A by the sputtering technique.

A4-7. Other Modifications of First Embodiment

According to the first embodiment described above, the distance A1 between the contact position P1 and the first planar portion 111 is shorter than the distance of the sheath formed between the negative pole of the work W and the first planar portion 111. Similarly the distance A2 between the contact position P2 and the second planar portion 121 is shorter than the distance of the sheath formed between the negative pole of the work W and the second planar portion 121. According to a modification, either one of the distance A1 and the distance A2 may be larger than the distance of the sheath, or both the distance A1 and the distance A2 may be larger than the distances of the sheaths. According to the first embodiment described above, the distance A1 and the distance A2 are equal to or less than 2.0 mm. According to a modification, either one of the distance A1 and the distance A2 may be greater than 2.0 mm, or both the distance A1 and the distance A2 may be greater than 2.0 mm.

According to the first embodiment described above, the first recessed portion 114 includes the lateral portion 112 and the bottom portion 113. According to a modification, the first recessed portion 114 may have any configuration to be recessed from the first planar portion 111 in a direction away from the film formation object 10 and may be, for example, in a semispherical shape. In this modification, the distance B1 between the negative pole of the work W and the bottom portion 113 of the first recessed portion 114 may be a distance between the negative pole of the work W opposed to the first recessed portion 114 and a position of the first recessed portion 114 farthest from the negative pole of the work W.

According to the above embodiment, the film forming vessel 100 and the pallet 130 have the ground potential.

According to a modification, in the process of film formation by plasma CVD, the film forming vessel 100 and the pallet 130 may not have the ground potential. The power application unit 70 may have any configuration to apply an electric power between the film forming vessel 100 and the film formation object 10 for film formation on the film formation object 10.

B. Second Embodiment

B1. Configuration of Film Forming Apparatus

Figure 8:
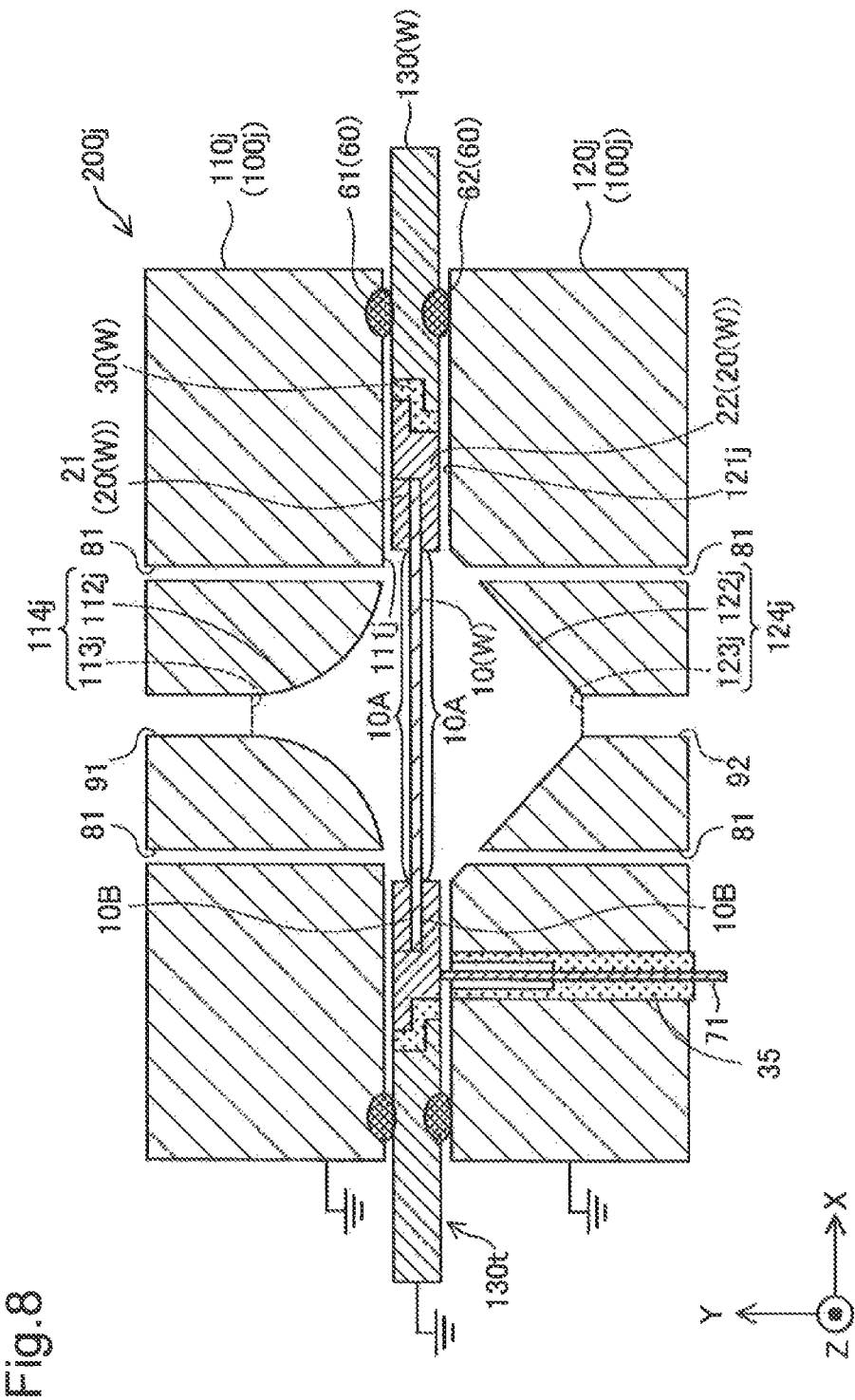
FIG. 8 is a schematic sectional view illustrating the configuration of a film forming apparatus according to a second embodiment.

FIG. 8 is a schematic sectional view illustrating the configuration of a film forming apparatus 200j according to a second embodiment. FIG. 8 illustrates the film forming apparatus 200j when a film forming vessel 100j is closed. According to this embodiment, a first recessed portion 114j of a first mold 110j includes an inclined surface 112j provided in at least part of between the exhaust port 91 and a first planar portion 111j and arranged to face the film formation target part 10A. According to this embodiment, the inclined surface 112j is a surface configured to connect a bottom portion 113j (exhaust port 91) of the first recessed portion 114j with the first planar portion 111j and arranged to face the film formation target part 10A. According to this embodiment, as shown in FIG. 8, the inclined surface 112j is a curved surface that is protruded toward the internal space of the first recessed portion 114j and is formed in an R shape. The presence of this inclined surface 112j causes the internal volume of the first recessed portion 114j of the first mold 110j to be smaller than the internal volume of the first recessed portion 114 of the first mold 110 according to the first embodiment described above.

According to this embodiment, a second recessed portion 124j of a second mold 120j also includes an inclined surface 122j provided in at least part of between the exhaust port 92 and a second planar portion 121j and arranged to face the film formation target part 10A. According to this embodiment, the inclined surface 122j is a surface configured to connect a bottom portion 123j (exhaust port 92) of the second recessed portion 124j with the second planar portion 121j and arranged to face the film formation target part 10A. According to this embodiment, as shown in FIG. 8, the inclined surface 122j is a planar surface configured to connect the second planar portion 121j with the bottom portion 123j. The presence of this inclined surface 122j causes the internal volume of the second recessed portion 124j of the second mold 120j to be smaller than the internal volume of the second recessed portion 124 of the second mold 120 according to the first embodiment described above. The other configuration of the film forming apparatus 200j of this embodiment is similar to that of the film forming apparatus 200 of the first embodiment described above and is thus not specifically described.

B2. Film Forming Method

According to the second embodiment, film formation is performed by the same procedure as the procedure of film forming method of the first embodiment described above. More specifically, when the film forming vessel 100j is opened, the controller 95 controls the exhaust device 90 to evacuate the film forming vessel 100j via the exhaust ports 91 and 92 (at step S65 in FIG. 4).

Figure 9:
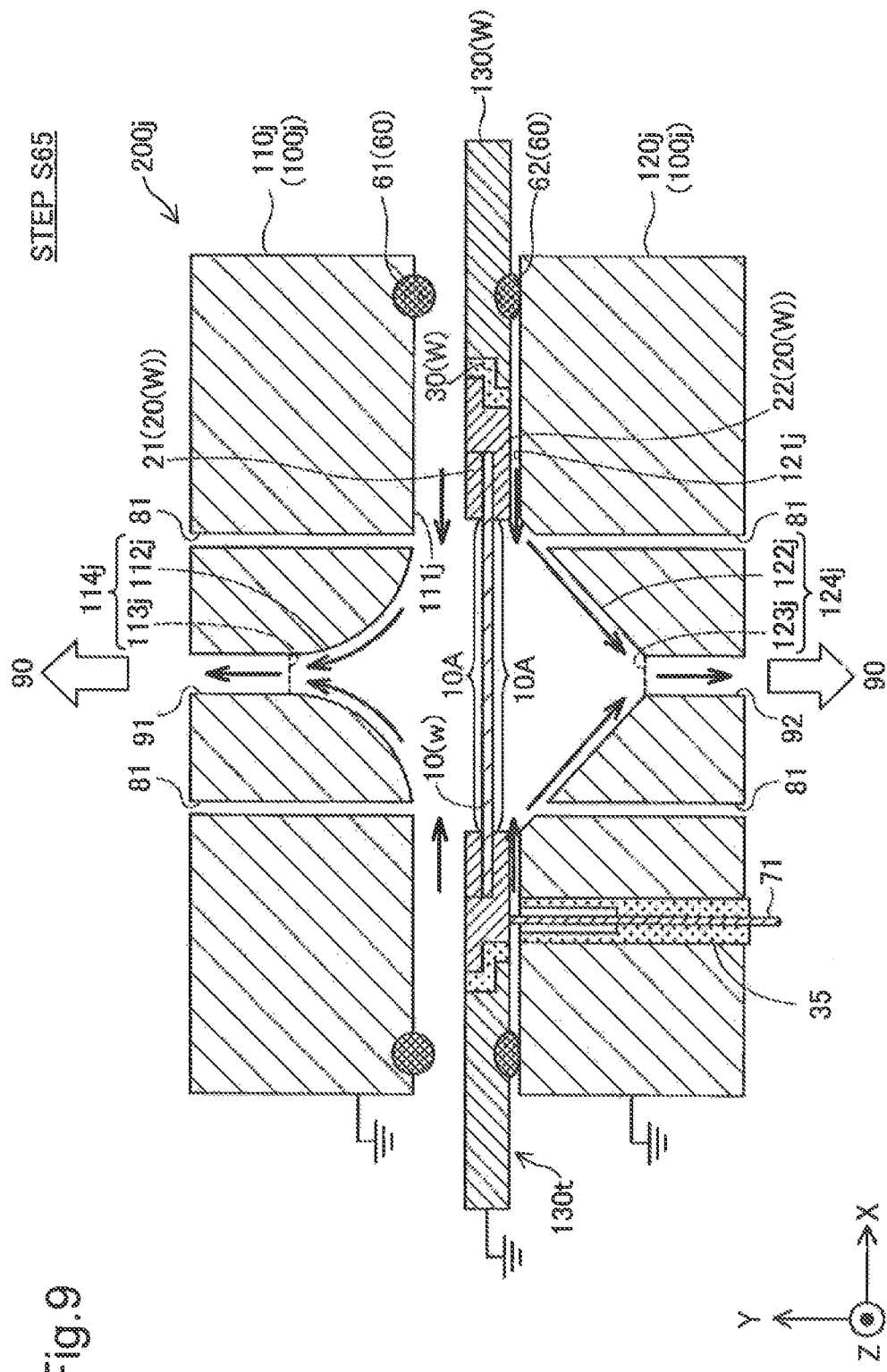
FIG. 9 is a diagram illustrating a process of step S65 according to the second embodiment.

FIG. 9 is a diagram illustrating the process of step S65 according to the second embodiment. Arrows shown in the film forming vessel 100j of FIG. 9 indicate the directions of gas flows formed in the film forming vessel 100j. The internal volume of the first recessed portion 114j in the film forming apparatus 200j of this embodiment is smaller than the internal volume of the first recessed portion 114 of the first embodiment described above. This provides the stronger gas flow from the first planar portion 111j-side toward the exhaust port 91, compared with the above first embodiment. Similarly the internal volume of the second recessed portion 124j is smaller than the internal volume of the second recessed portion 124 of the first embodiment described above. This provides the stronger gas flow from the second planar portion 121j-side toward the exhaust port 92, compared with the above first embodiment.

B3. Advantageous Effects

In the film forming apparatus 200j and the film forming method of the second embodiment, the internal volume of the first recessed portion 114j is smaller than the internal volume in the configuration without the inclined surface 112j. This provides the strong gas flow from the first planar portion 111j-side toward the exhaust port 91 and more effectively suppresses the undesired substance from adhering to the seal member 60, compared with the configuration without the inclined surface 112j. Accordingly the configuration of this embodiment further keeps the inside of the film forming vessel 100j airtight when the film forming vessel 100j is closed, and thereby further suppresses poor film formation.

In the film forming apparatus 200j and the film forming method of the second embodiment, the inclined surface 112j is the curved surface configured to connect the first planar portion 111j with the exhaust port 91 and protruded toward the internal space of the first recessed portion 114j. Compared with the configuration that the inclined surface 112j is a planar surface to connect the first planar portion 111j with the exhaust port, this configuration further decreases the internal volume of the first recessed portion 114j and provides the stronger gas flow from the first planar portion 111j-side toward the exhaust port 91. This configuration thus further suppresses the undesired substance from adhering to the seal member 60 and thereby further suppresses poor film formation.

The internal volume of the second recessed portion 124j is smaller than the internal volume in the configuration without the inclined surface 122j. This provides the stronger gas flow from the second planar portion 121j-side toward the exhaust port 92 and more effectively suppresses the undesired substance from adhering to the seal member 60, compared with the configuration without the inclined surface 122j. The mold placed in the lower part where the undesired substance is likely to be accumulated (i.e., the second mold 120j) includes the inclined surface 122j. This configuration enables the undesired substance to be more effectively discharged from the film forming apparatus 200j and further suppresses the undesired substance from adhering to the seal member 60. This accordingly further suppresses poor film formation.

The inclined surface 122j of the mold located below the work W (i.e., the second mold 120j) is the planar surface configured to connect the second planar portion 121j with the exhaust port 92. This configuration suppresses accumulation of the undesired substance falling down (in the direction toward the second mold 120j) in the film forming vessel 100j and enables the undesired substance to be effectively discharged out of the film forming vessel 100j by the exhaust device 90. This configuration thus effectively suppresses the undesired substance from adhering to the seal member 60 and thereby effectively suppresses poor film formation.

Additionally, in the film forming apparatus 200j of the second embodiment, the first recessed portion 114j includes the inclined surface 112j, and the second recessed portion 124j includes the inclined surface 122j. This provides the smaller space of evacuation for the purpose of film formation, compared with the film forming apparatus 200 of the first embodiment described above. Accordingly this further shortens the time period required for evacuation for the purpose of film formation and thereby further shortens the time period required for film formation on the film formation target part 10A.

Furthermore, in the film forming apparatus 200j of the second embodiment, when the film forming vessel 100j is opened, the film forming vessel 100j is evacuated via the exhaust ports 91 and 92 by the exhaust device 90. This accordingly suppresses the undesired substance from adhering to the seal member 60 and suppresses poor film formation, like the first embodiment.

B4. Modifications of Second Embodiment

According to the second embodiment described above, the first mold 110j and the second mold 120j respectively include the inclined surface 112j and the inclined surface 122j. According to a modification, an inclined surface may be provided in at least one of the first mold 110j and the second mold 120j. In the case where the inclined surface is provided in at least one of the first mold 110j and the second mold 120j, it is preferable to provide the inclined surface in the mold located below the work W. This configuration enables the undesired substance to be effectively discharged in the mold located in the lower part where the undesired substance is likely to be accumulated, and thus effectively suppresses the undesired substance from adhering to the seal member 60.

According to the second embodiment described above, the inclined surface 112j of the first mold 110j is the curved surface protruded toward the internal space of the first recessed portion 114j and is formed in an R shape. The inclined surface 122j of the second mold 120j is the planar surface configured to connect the exhaust port 92 (bottom portion 123j) with the second planar portion 121j. According to a modification, the inclined surface 112j of the first mold 110j may be a planar surface configured to connect the exhaust port 91 with the first planar portion 111j, and the inclined surface of the second mold 120j may be a curved surface protruded toward the internal space of the second recessed portion 124j. The first recessed portion 114j may include the inclined surface 112j of any configuration that is provided in at least part of between the exhaust port 91 and the first planar portion 111j and is arranged to face the film formation target part 10A. In other words, the inclined surface 112j may be formed in any configuration that reduces the internal volume of the first recessed portion 114j and provides the stronger gas flow from the first planar portion 111j-side toward the exhaust port 91, compared with the configuration of the first recessed portion 114j without the inclined surface 112j. Similarly the second recessed portion 124j may include the inclined surface 122j of any configuration that is provided in at least part of between the exhaust port 92 and the second planar portion 121j and is arranged to face the film formation target part 10A. In other words, the inclined surface 122j may be formed in any configuration that reduces the internal volume of the second recessed portion 124j and provides the stronger gas flow from the second planar portion 121j-side toward the exhaust port 92, compared with the configuration of the second recessed portion 124j without the inclined surface 122j. The inclined surface preferably has no irregularities, in terms of suppressing accumulation of the undesired substance in the film forming vessel 100j.

C. Third Embodiment

C1. Film Forming Apparatus

Figure 10:
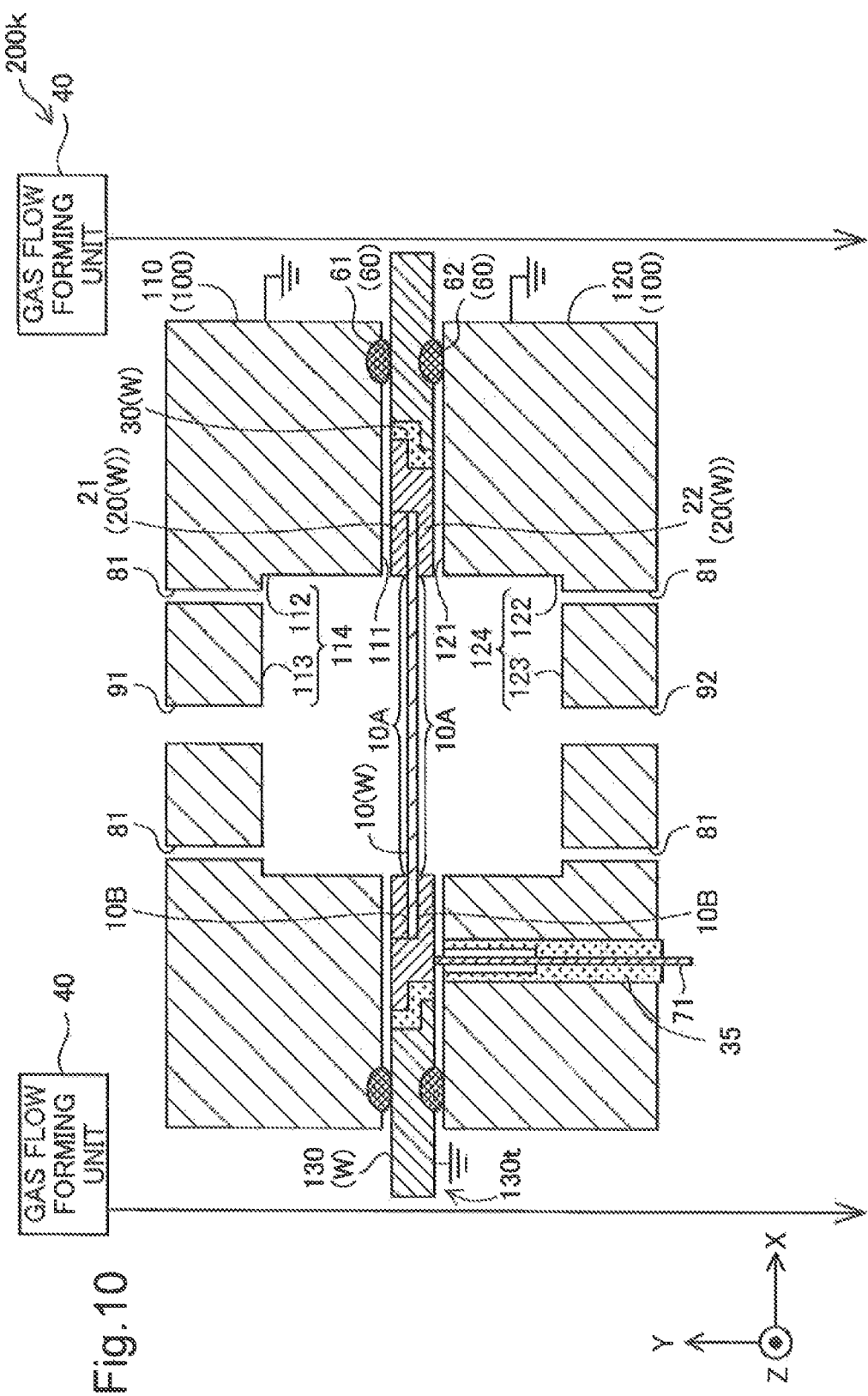
FIG. 10 is a schematic sectional view illustrating the configuration of a film forming apparatus according to a third embodiment.

FIG. 10 is a schematic sectional view illustrating the configuration of a film forming apparatus 200k according to a third embodiment. FIG. 10 illustrates the film forming apparatus 200k when the film forming vessel 100 is closed. The film forming apparatus 200k of this embodiment includes a gas flow forming unit 40. The gas flow forming unit 40 is a device configured to form a gas flow from the first mold 110-side toward the second mold 120-side or a gas flow from the second mold 120-side toward the first mold 110-side outside of the film forming vessel 100, for example, by a fan. The direction of the gas flow formed by the gas flow forming unit 40 is approximately perpendicular to the first planar portion 111. According to this embodiment, the controller 95 may control the gas flow forming unit 40 to form the gas flow from the first mold 110-side toward the second mold 120-side or the gas flow from the second mold 120-side toward the first mold 110-side outside of the film forming vessel 100, at least when the film forming vessel 100 is opened. The rate of the gas flow formed by the gas flow forming unit 40 is higher than the rate of evacuation from the exhaust ports 91 and 92 by the exhaust device 90 when the film forming vessel 100 is opened. According to this embodiment, the gas flow forming unit 40 forms the gas flow from the first mold 110-side toward the second mold 120-side. According to this embodiment, the gas flow forming unit 40 makes a downward flow of a clean gas in the film forming apparatus 200k to form a downward flow outside of the film forming vessel 100. The other configuration of the film forming apparatus 200k of this embodiment is similar to that of the film forming apparatus 200 of the first embodiment described above and is thus not specifically described.

C2. Film Forming Method

Figure 11:
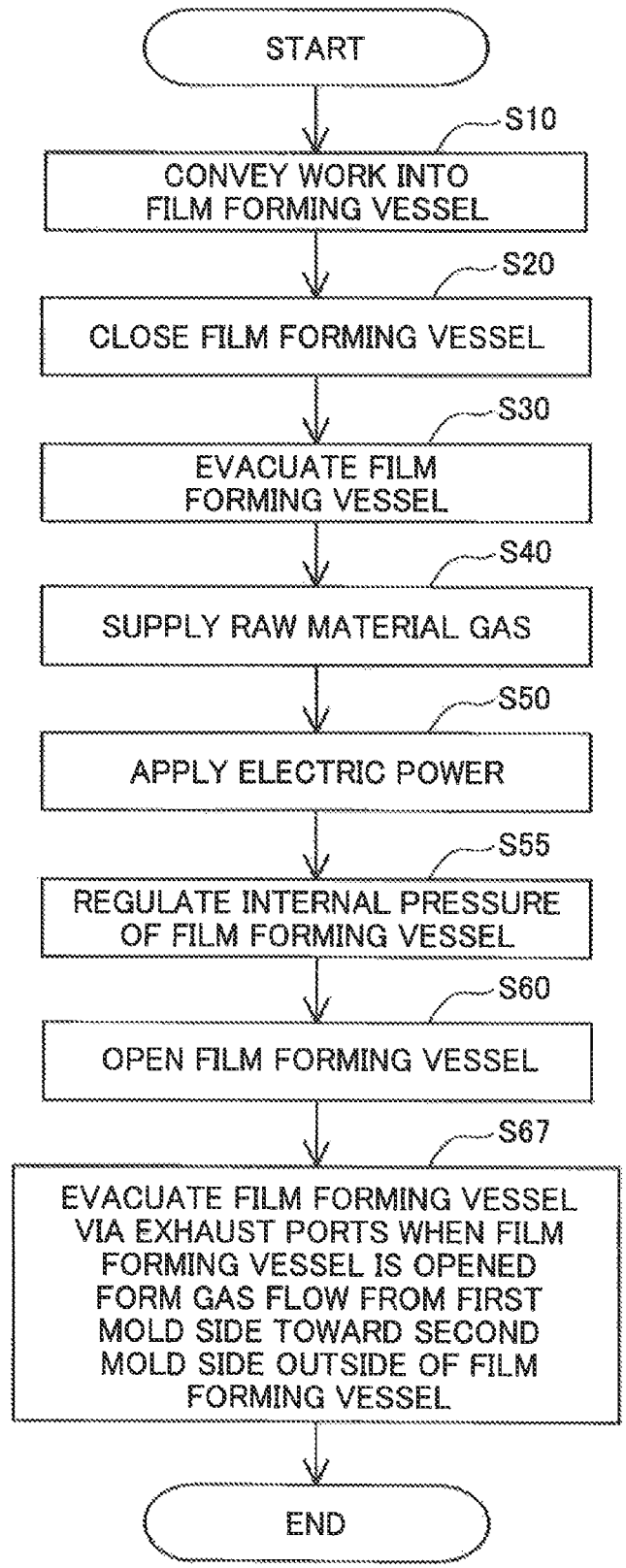
FIG. 11 is a process chart showing a film forming method by the film forming apparatus according to the third embodiment.

FIG. 11 is a process chart showing a film forming method by the film forming apparatus 200. The procedure of film forming method of this embodiment performs film formation (steps S10 to S50), regulates the internal pressure of the film forming vessel 100 (step S55) and opens the film forming vessel 100 (step S60), like the first embodiment described above. According to this embodiment, at the start of step S60, the controller 95 controls the exhaust device 90 to evacuate the film forming vessel 100 via the exhaust ports 91 and 92 and additionally controls the gas flow forming unit 40 to form the gas flow from the first mold 110-side toward the second mold 120-side outside of the film forming vessel 100 (step S67). The process of step S67 is also called "process (c)".

Figure 12:
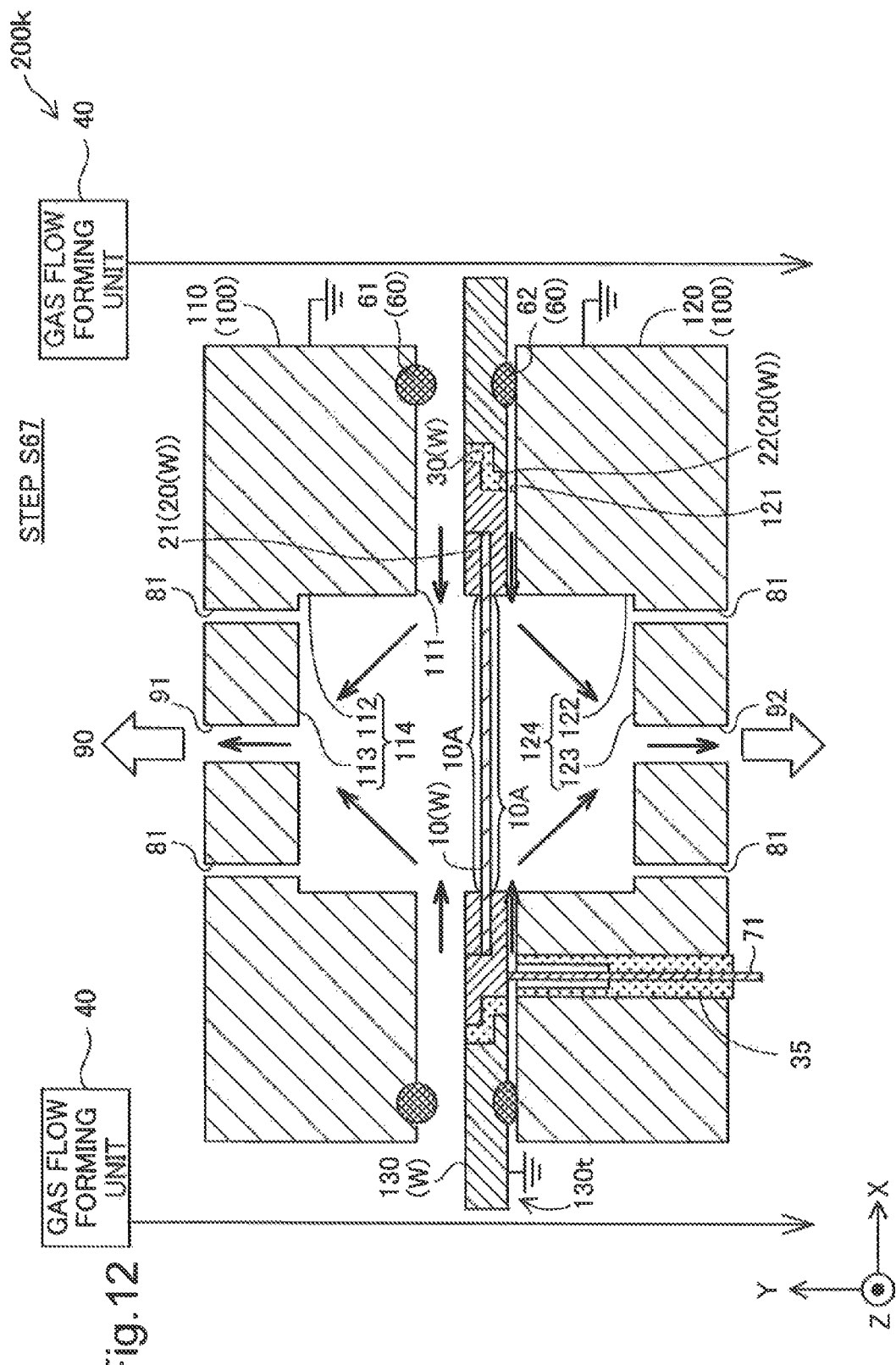
FIG. 12 is a diagram illustrating a process of step S67 according to the third embodiment.

FIG. 12 is a diagram illustrating the process of step S67. Arrows shown outside of the flint forming vessel 100 of the film forming apparatus 200k of FIG. 12 indicate the directions of gas flows formed outside of the film forming vessel 100. When the film forming vessel 100 is opened, the gas flow forming unit 40 forms the gas flow from the first mold 110-side toward the second mold 120-side (i.e., downward).

The gas flow formed by the gas flow forming unit 40 moves an undesired substance outside of the film forming vessel 100 from the first mold 110-side toward the second mold 120-side. Like the first embodiment described above, when the film forming vessel 100 is opened, the film forming vessel 100 is evacuated via the exhaust ports 91 and 92 by the exhaust device 90 (step S67 in FIG. 11). The gas flow is thus formed from the first planar portion 111-side toward the exhaust port 91 in the film forming vessel 100. The gas flow is also formed from the second planar portion 121-side toward the exhaust port 92. Accordingly an undesired substance produced in the course of film formation is moved from the first planar portion 111 of the first mold 110 toward the exhaust port 91 to be discharged out of the film forming vessel 100 via the exhaust port 91 or is moved from the second planar portion 121 of the second mold 120 toward the exhaust port 92 to be discharged out of the film forming vessel 100 via the exhaust port 92. This completes the series of film forming method by the film forming apparatus 200k.

C3. Advantageous Effects

In the film forming apparatus 200k and the film forming method of the third embodiment, the gas flow is formed from the first mold 110-side toward the second mold 120-side outside of the film forming vessel 100. This suppresses invasion of the undesired substance from outside of the film forming vessel 100 into the film forming vessel 100. Accordingly this configuration effectively suppresses the undesired substance from adhering to the seal member 60 and thereby effectively suppresses poor film formation.

Additionally, in the film forming apparatus 200k and the film forming method of the third embodiment, when the film forming vessel 100 is opened, the film forming vessel 100 is evacuated via the exhaust ports 91 and 92 by the exhaust device 90. This accordingly suppresses the undesired substance from adhering to the seal member 60 and suppresses poor film formation, like the first embodiment.

C4. Modification of Third Embodiment

According to the third embodiment described above, the gas flow forming unit 40 forms the gas flow from the first mold 110-side toward the second mold 120-side. According to a modification, the gas flow forming unit 40 may form a gas flow from the second mold 120-side toward the first mold 110-side. This modification also suppresses invasion of the undesired substance from outside of the film forming vessel 100 into the film forming vessel 100 and thereby effectively suppresses poor film formation.

D. Fourth Embodiment

D1. Configuration of Film Forming Apparatus

Figure 13:
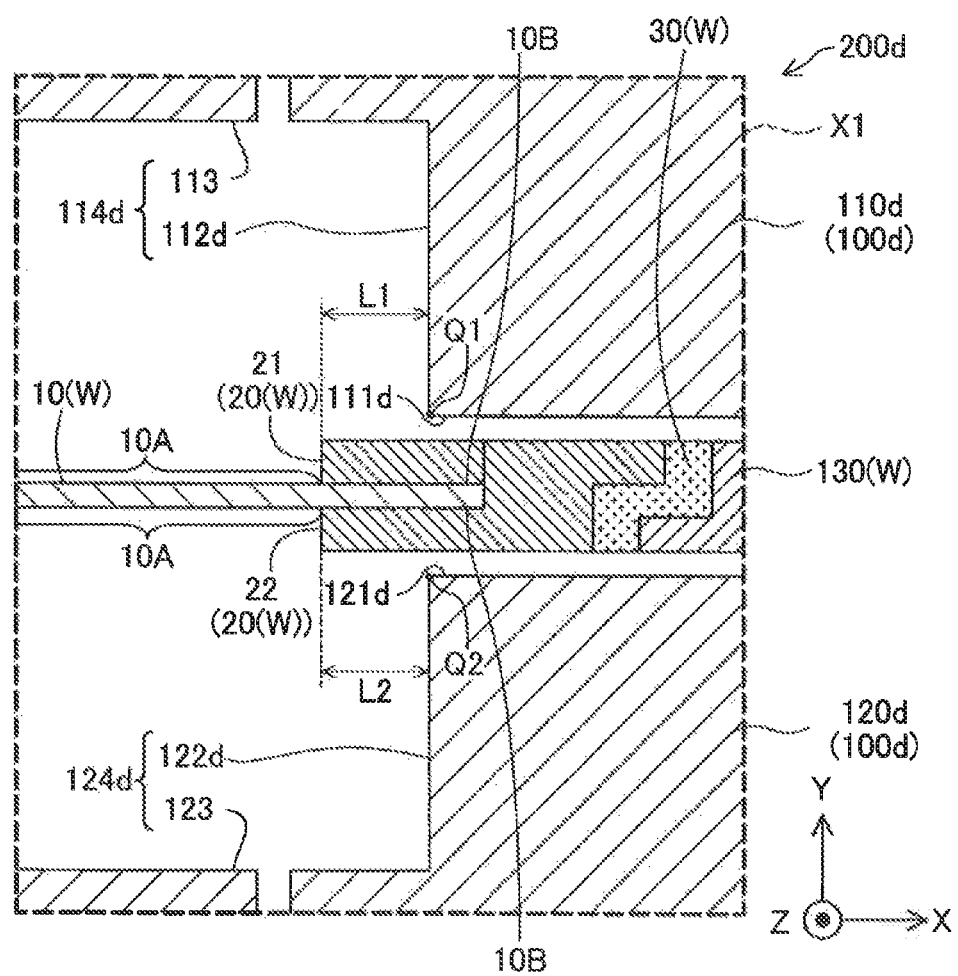
FIG. 13 is a partial schematic sectional view illustrating part of the configuration of a film forming apparatus according to a fourth embodiment.

FIG. 13 is a partial schematic sectional view illustrating part of the configuration of a film forming apparatus 200d according to a fourth embodiment. FIG. 13 illustrates an area X1 corresponding to the area X of FIG. 1. In the film forming apparatus 200d of this embodiment, a connecting position Q1 of a first recessed portion 114d (more specifically, its lateral portion 112d) with a first planar portion 111d of a first mold 110d is located away from an end of the film formation target part 10A toward the insulating member 30. Similarly a connecting position Q2 of a second recessed portion 124d (more specifically, its lateral portion 122d) with a second planar portion 121d of a second mold 120d is located away from the end of the film formation target part 10A toward the insulating member 30.

FIG. 13 shows a distance L1 along the X axis between the connecting position Q1 of the first recessed portion 114d with the first planar portion 111d and the end of the film formation target part 10A. FIG. 13 also shows a distance L2 along the X axis between the connecting position Q2 of the second recessed portion 124d with the second planar portion 121d and the end of the film formation target part 10A. According to this embodiment, the distance L1 is equal to the distance L2. For example, when an electric power of −1000 V is applied to the negative pole of the work W by the power application unit 70 and a film forming vessel 100d has an internal pressure of 10 Pa, the distances L1 and L2 are preferably equal to or greater than approximately 3 mm. In another example, when an electric power of −3000 V is applied to the negative pole of the work W by the power application unit 70 and a film forming vessel 100d has an internal pressure of 10 Pa, the distances L1 and L2 are preferably equal to or greater than approximately 9 mm. The distances L1 and L2 may be changed depending on the electric power applied by the power application unit 70 and the internal pressure (degree of vacuum) of the film forming vessel 100d. The other configuration of the film forming apparatus 200d of this embodiment is similar to that of the film forming apparatus 200 of the first embodiment described above and is thus not specifically described.

D2. Advantageous Effects

The film is formed on the film formation target part by producing plasma between the negative pole of the work, to which an electric power is applied, and the film forming vessel. It is accordingly preferable that the distance between the film formation target part and the film forming vessel is larger than the distance of the sheath. Plasma may not be produced in a place where the film formation target part is near to the film forming vessel. This may cause poor film formation at an end of the film formation target part. In the film forming apparatus 200d of this embodiment, however, the connecting position Q1 of the first recessed portion 114d with the first planar portion 111d in the film forming vessel 100d is located away from the end of the film formation target part 10A of the upper face of the work W toward the insulating member 30. This configuration ensures the distance between the film formation target part 10A of the upper face of the work W and the film forming vessel 100d. This configuration accordingly suppresses poor film formation at the end of the film formation target part 10A of the upper face of the work W.

The connecting position Q2 of the second recessed portion 124d with the second planar portion 121d in the film forming vessel 100d is located away from the end of the film formation target part 10A of the lower face of the work W toward the insulating member 30. This configuration ensures the distance between the film formation target part 10A of the lower face of the work W and the film forming vessel 100d. This configuration accordingly suppresses poor film formation at the end of the film formation target part 10A of the lower face of the work W.

Additionally, the film forming apparatus 200d of this embodiment has the advantageous effect similar to the advantageous effect 2 of the first embodiment described above. The film forming apparatus 200d accordingly reduces the possibility of abnormal electrical discharge.

D3. Modification of Fourth Embodiment

According to the fourth embodiment described above, the distance L1 between the connecting position Q1 of the first recessed portion 114d with the first planar portion 111d and the end of the film formation target part 10A is equal to the distance L2 between the connecting position Q2 of the second recessed portion 124d with the second planar portion 121d and the end of the film formation target part 10A. According to a modification, the distance L1 may be different from the distance L2. For example, only the connecting position Q1 of the first recessed portion 114d with the first planar portion 111d may be located away from the end of the film formation target part 10A of the upper face of the work W toward the insulating member 30, or only the connecting position Q2 of the second recessed portion 124d with the second planar portion 121d may be located away from the end of the film formation target part 10A of the lower face of the work W toward the insulating member 30.

E. Other Modifications

In the embodiments described above, the film formation object 10 is a separator. The film formation object 10 may, however, be any member having electrical conductivity. In the above embodiments, each of the film forming apparatuses 200 to 200m is configured to form a carbon-based thin film. The film forming apparatus may, however, be configured to form a thin film of another conductive element such as gold (Au), platinum (Pt), tantalum (Ta) or silicon (Si).

In the above embodiments, each of the seal members 60 (61, 62) and 60b is a rubber annular member. Each of the seal members 60 (61, 62) and 60b may, however, be any member configured to keep the inside of the film forming vessel 100, 100b, 100d, 100j or 100m airtight when the film forming vessel 100, 100b, 100d, 100j or 100m is closed. For example, each of the seal members 60 (61, 62) and 60b may be integrated with the work W, the first mold or the second mold by attachment or injection molding. For example, when the seal member 61 is integrated with the first mold 110, the seal member 61 may be formed in a convex structure to face the work W (pallet 130).

In the above embodiments, the first mold 110 may be replaced with the second mold 120. In other words, the second mold may be used as the first mold, and the first mold may be used as the second mold.

The disclosure is not limited to any of the embodiments and their modifications described above but may be implemented by a diversity of other configurations without departing from the scope of the disclosure. For example, the technical features of any of the embodiments and their modifications may be replaced or combined appropriately, in order to solve part or all of the problems described above or in order to achieve part or all of the advantageous effects described above. The elements other than those described in independent claims among the elements included in the respective embodiments and their modifications described above are additional elements and may be appropriately omitted. The present disclosure may be implemented by aspects described below.

(1) According to one aspect of the disclosure, there is provided a film forming method by a film forming apparatus configured to form a film on part of a work. The film forming apparatus comprises a film forming vessel comprising a first mold and a second mold that is arranged to be opposed to the first mold. The first mold is configured to include a first recessed portion and a first planar portion arranged around the first recessed portion and an exhaust port in a bottom portion of the first recessed portion. The film forming apparatus also comprises a seal member placed between the first planar portion of the first mold and the second mold. The seal member is configured to keep inside of the film forming vessel airtight when the film forming vessel is closed; an exhaust device connected with the exhaust port and configured to evacuate the film forming vessel; and an open-close device configured to open and close the film forming vessel. The work is placed away from the first planar portion such that a film formation target part of the work faces an internal space of the first recessed portion when the film forming vessel is closed. This film forming method comprises (a) forming a film on part of the work by the film forming apparatus; (b) moving the first mold relative to the work in a direction of separating away from each other and opening the film forming vessel by the open-close device, after the (a); and (c) at a start of the (b), evacuating the film forming vessel via the exhaust port by the exhaust device. In the film forming method of this aspect, when the film forming vessel is opened, the film forming vessel is evacuated via the exhaust port provided in the bottom portion of the first recessed portion. This forms a gas flow from the first planar portion side toward the exhaust port in the film forming vessel, when the film forming vessel is opened. This gas flow discharges an undesired substance out of the film forming vessel via the exhaust port and thereby suppresses the undesired substance from adhering to the seal member. This configuration accordingly keeps the inside of the film forming vessel airtight when the film forming vessel is closed, and thereby suppresses poor film formation.

(2) In the film forming method of the above aspect, the first recessed portion may include an inclined surface provided in at least part of between the exhaust port and the first planar portion and arranged to face the film formation target part. In the film forming method of this aspect, the internal volume of the first recessed portion is smaller than the internal volume in a configuration without the inclined surface and provides the strong gas flow from the first planar portion side toward the exhaust port. This configuration further suppresses the undesired substance from adhering to the seal member and thereby further suppresses poor film formation.

(3) In the film forming method of the above aspect, the first mold may be located below the work. The undesired substance is likely to be accumulated in a lower part of the film forming vessel. In the film forming method of this aspect, however, when the film forming vessel is opened, the gas flow is formed from the first planar portion side toward the exhaust port in the first mold located below the work. This configuration enables the undesired substance to be discharged via the exhaust port in the mold placed in the lower part where the undesired substance is likely to be accumulated. This further accelerates discharge of the undesired substance from the film forming vessel and further suppresses the undesired substance from adhering to the seal member. This accordingly further suppresses poor film formation.

(4) In the film forming method of the above aspect, the film forming apparatus may further comprise a gas flow forming unit configured to form at least one of a gas flow from the first mold side toward the second mold side and a gas flow from the second mold side toward the first mold side outside of the film forming vessel. The film forming method may comprise the (c) forming the gas flow outside of the film forming vessel by the gas flow forming unit, while evacuating the film forming vessel via the exhaust port by the exhaust device at the start of (b). In the film forming method of this aspect, when the film forming vessel is opened, the gas flow from the first mold side toward the second mold side or the gas flow from the second mold side toward the first mold side is formed outside of the film forming vessel. This configuration suppresses invasion of the undesired substance from outside of the film forming vessel into the film forming vessel. This effectively suppresses the undesired substance from adhering to the seal member and thereby effectively suppresses poor film formation.

(5) According to another aspect of the disclosure, there is provided a film forming apparatus configured to form a film on part of a work. This film forming apparatus comprises a film forming vessel comprising a first mold and a second mold that is arranged to be opposed to the first mold. The first mold is configured to include a first recessed portion and a first planar portion arranged around the first recessed portion and an exhaust port in a bottom portion of the first recessed portion. The film forming apparatus also comprises a seal member placed between the first planar portion of the first mold and the second mold. The seal member is configured to keep inside of the film forming vessel airtight when the film forming vessel is closed; an exhaust device connected with the exhaust port and configured to evacuate the film forming vessel; an open-close device configured to open and close the film forming vessel; and a controller. The work is placed away from the first planar portion such that a film formation target part of the work faces an internal space of the first recessed portion when the film forming vessel is closed. The controller is configured to: after film formation on part of the work, control the open-close device to move the first mold relative to the work in a direction of separating away from each other and to open the film forming vessel; and when the film forming vessel is opened, control the exhaust device to evacuate the film forming vessel via the exhaust port. In the film forming apparatus of this aspect, the exhaust device evacuates the film forming vessel via the exhaust port provided in the bottom portion of the first recessed portion. This forms a gas flow from the first planar portion side toward the exhaust port. This gas flow discharges an undesired substance out of the film forming vessel via the exhaust port and thereby suppresses the undesired substance from adhering to the seal member. This configuration accordingly keeps the inside of the film forming vessel airtight when the film forming vessel is closed, and thereby suppresses poor film formation.

(6) In the film forming apparatus of the above aspect, the first recessed portion may include an inclined surface provided in at least part of between the exhaust port and the first planar portion and arranged to face the film formation target part. In the film forming apparatus of this aspect, the internal volume of the first recessed portion is smaller than the internal volume in a configuration without the inclined surface and provides the strong gas flow from the first planar portion side toward the exhaust port. This configuration further suppresses the undesired substance from adhering to the seal member and thereby further suppresses poor film formation.

(7) In the film forming apparatus of the above aspect, the first mold may be located below the work. The undesired substance is likely to be accumulated in a lower part of the film forming vessel. In the film forming apparatus of this aspect, however, when the film forming vessel is opened, the gas flow is formed from the first planar portion side toward the exhaust port in the first mold located below the work. This configuration enables the undesired substance to be discharged via the exhaust port in the mold placed in the lower part where the undesired substance is likely to be accumulated. This further accelerates discharge of the undesired substance from the film forming vessel and further suppresses the undesired substance from adhering to the seal member. This accordingly further suppresses poor film formation.

(8) The film forming apparatus of the above aspect may further comprise a gas flow forming unit configured to form at least one of a gas flow from the first mold side toward the second mold side and a gas flow from the second mold side toward the first mold side outside of the film forming vessel. When the film forming vessel is opened after film formation on part of the work, the controller may be configured to control the gas flow forming unit to form the gas flow outside of the film forming vessel, while controlling the exhaust device to evacuate the film forming vessel via the exhaust port. In the film forming apparatus of this aspect, when the film forming vessel is opened, the gas flow from the first mold side toward the second mold side or the gas flow from the second mold side toward the first mold side is formed outside of the film forming vessel. This configuration suppresses invasion of the undesired substance from outside of the film forming vessel into the film forming vessel. This effectively suppresses the undesired substance from adhering to the seal member and thereby effectively suppresses poor film formation.

The disclosure may be implemented by any of various aspects other than the film forming method and the film forming apparatus described above, for example, a control method and a control apparatus of the film forming apparatus, a computer program configured to implement any of these methods and apparatuses, and a non-transitory recording medium in which such a computer program is recorded.

What is claimed is:

1. A film forming method by a film forming apparatus configured to form a film on part of a work, the film forming apparatus comprising:

a film forming vessel comprising a first mold and a second mold that is arranged to be opposed to the first mold, the first mold comprising a first recessed portion and a first planar portion arranged around the first recessed portion and an exhaust port in a bottom portion of the first recessed portion, and a seal member placed between the first planar portion of the first mold and the second mold, the seal member being configured to keep inside of the film forming vessel airtight when the film forming vessel is closed, wherein the work is placed away from the first planar portion such that a film formation target part of the work faces an internal space of the first recessed portion when the film forming vessel is closed, and the film forming vessel sandwiches the work between the first mold and the second mold via the seal member positioned in between the first mold and the second mold when the film forming vessel is in a closed state, the film forming method comprising:

(a) forming a film on part of the work by the film forming apparatus;

(b) regulating an internal pressure of the film forming vessel to make the internal pressure of the film forming vessel lower than a pressure outside of the film forming vessel;

(c) moving the first mold relative to the work in a direction of separating away from each other and opening the film forming vessel after (a) and (b); and (d) from a time immediately before the film forming vessel is opened to a time when the film forming vessel has been opened, evacuating the film forming vessel via the exhaust port.

2. The film forming method according to claim 1,
wherein the first recessed portion includes an inclined surface provided between the exhaust port and the first planar portion and inclined from the first planar portion toward the exhaust port.

3. The film forming method according to claim 1,
wherein the first mold is located below the work.

4. The film forming method according to claim 1, further comprising:
causing a gas flow from the first mold side toward the second mold side or a gas flow from the second mold side toward the first mold side along an outside of the film forming vessel, while evacuating the film forming vessel via the exhaust port from a time immediately before the film forming vessel is opened to a time when the film forming vessel has been opened.

* * * * *